US009910199B2

(12) United States Patent
Hayashi et al.

(10) Patent No.: US 9,910,199 B2
(45) Date of Patent: *Mar. 6, 2018

(54) DISPLAY

(71) Applicant: MITSUBISHI ELECTRIC CORPORATION, Tokyo (JP)

(72) Inventors: Masami Hayashi, Kumamoto (JP); Kenichi Miyamoto, Kumamoto (JP); Nobuaki Ishiga, Kumamoto (JP); Naoki Tsumura, Kumamoto (JP); Kensuke Nagayama, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/241,518

(22) Filed: Aug. 19, 2016

(65) Prior Publication Data
US 2016/0356933 A1 Dec. 8, 2016

Related U.S. Application Data

(60) Continuation of application No. 14/959,558, filed on Dec. 4, 2015, now Pat. No. 9,459,380, which is a (Continued)

(30) Foreign Application Priority Data

Oct. 12, 2012 (JP) .................. 2012-226843

(51) Int. Cl.
*H01L 33/44* (2010.01)
*G02B 1/11* (2015.01)
(Continued)

(52) U.S. Cl.
CPC ............... *G02B 5/285* (2013.01); *G02B 1/11* (2013.01); *G02B 1/113* (2013.01); *G02B 1/116* (2013.01);
(Continued)

(58) Field of Classification Search
CPC .......... H01L 33/44; G02B 1/11; G02B 1/113; G02B 1/116; G02B 5/285; G06F 3/041; H05K 3/061
See application file for complete search history.

(56) References Cited

U.S. PATENT DOCUMENTS 7,116,044 B2 10/2006 Fukunaga
8,159,749 B2 4/2012 Inoue et al.
(Continued)

FOREIGN PATENT DOCUMENTS

JP H09-232278 A 9/1997
JP 2003-160362 A 6/2003
(Continued)

OTHER PUBLICATIONS

An Office Action; "Notification of Reason(s) for Refusal" issued by the Japanese Patent Office dated Dec. 6, 2016, which corresponds to Japanese Patent Application No. 2012-226843 and is related to U.S. Appl. No. 15/241,518; with English language partial translation.
(Continued)

*Primary Examiner* — Dao H Nguyen
(74) *Attorney, Agent, or Firm* — Studebaker & Brackett PC

(57) ABSTRACT

A display includes: a laminated wiring with a conductive film arranged on a foundation layer, and a transparent film and a translucent film arranged on the conductive film; a wiring terminal part arranged at an edge portion of the laminated wiring and having the same laminated structure as that of the laminated wiring; and an insulating film that covers the laminated wiring and the wiring terminal part.

14 Claims, 21 Drawing Sheets

Related U.S. Application Data division of application No. 14/046,782, filed on Oct. 4, 2013, now Pat. No. 9,250,363.

(51) Int. Cl.

| | | |
|---|---|---|
| *G06F 3/041* | (2006.01) | |
| *G02B 5/28* | (2006.01) | |
| *G02B 1/116* | (2015.01) | |
| *H05K 3/06* | (2006.01) | |
| *G02B 1/113* | (2015.01) | |

(52) U.S. Cl.
CPC ............ *H01L 33/44* (2013.01); *H05K 3/061* (2013.01); *G06F 3/041* (2013.01); *G06F 2203/04103* (2013.01)

(56) References Cited

U.S. PATENT DOCUMENTS

| | | | |
|---|---|---|---|
| 8,482,189 B2 | 7/2013 | Goto et al. | |
| 9,001,052 B2 | 4/2015 | Rho et al. | |
| 9,040,992 B2* | 5/2015 | Hayashi | H01L 33/44 |
| | | | 257/59 |
| 9,250,363 B2* | 2/2016 | Hayashi | G02B 1/113 |
| 9,459,380 B2* | 10/2016 | Hayashi | G02B 1/113 |
| 2007/0040172 A1 | 2/2007 | Kawakami et al. | |
| 2007/0096098 A1 | 5/2007 | Ishiga et al. | |
| 2009/0304912 A1 | 12/2009 | Kwak et al. | |
| 2011/0148823 A1* | 6/2011 | Chen | G06F 3/044 |
| | | | 345/176 |
| 2011/0227839 A1 | 9/2011 | Rho et al. | |
| 2011/0241000 A1* | 10/2011 | Choi | H01L 51/5265 |
| | | | 257/59 |
| 2012/0137525 A1 | 6/2012 | Haczek et al. | |
| 2013/0285023 A1 | 10/2013 | Kurata et al. | |
| 2013/0285079 A1 | 10/2013 | Hayashi et al. | |
| 2014/0008634 A1* | 1/2014 | Matsuura | H01L 51/0096 |
| | | | 257/40 |

FOREIGN PATENT DOCUMENTS

| | | |
|---|---|---|
| JP | 2007-101622 A | 4/2007 |
| JP | 2007-123672 A | 5/2007 |
| JP | 2009-222910 A | 10/2009 |
| JP | 2010-079240 A | 4/2010 |
| JP | 2010-257492 A | 11/2010 |
| JP | 2011-191606 A | 9/2011 |
| JP | 2011-192251 A | 9/2011 |
| JP | 2011-216042 A | 10/2011 |
| JP | 2012-133597 A | 7/2012 |
| WO | 2012/0106424 A2 | 8/2012 |
| WO | 2012/137525 A1 | 10/2012 |

OTHER PUBLICATIONS

U.S. Appl. No. 13/870,732: filed Apr. 25, 2011.
U.S. Appl. No. 14/046,782: filed Oct. 4, 2011.
An Office Action; "Notification of Reasons for Refusal"; issued by the Japanese Patent Office dated Jul. 19, 2016, which corresponds to Japanese Patent Application No. 2012-226843 and is related to U.S. Appl. No. 14/959,558; with partial English language translation.

\* cited by examiner

F I G . 1
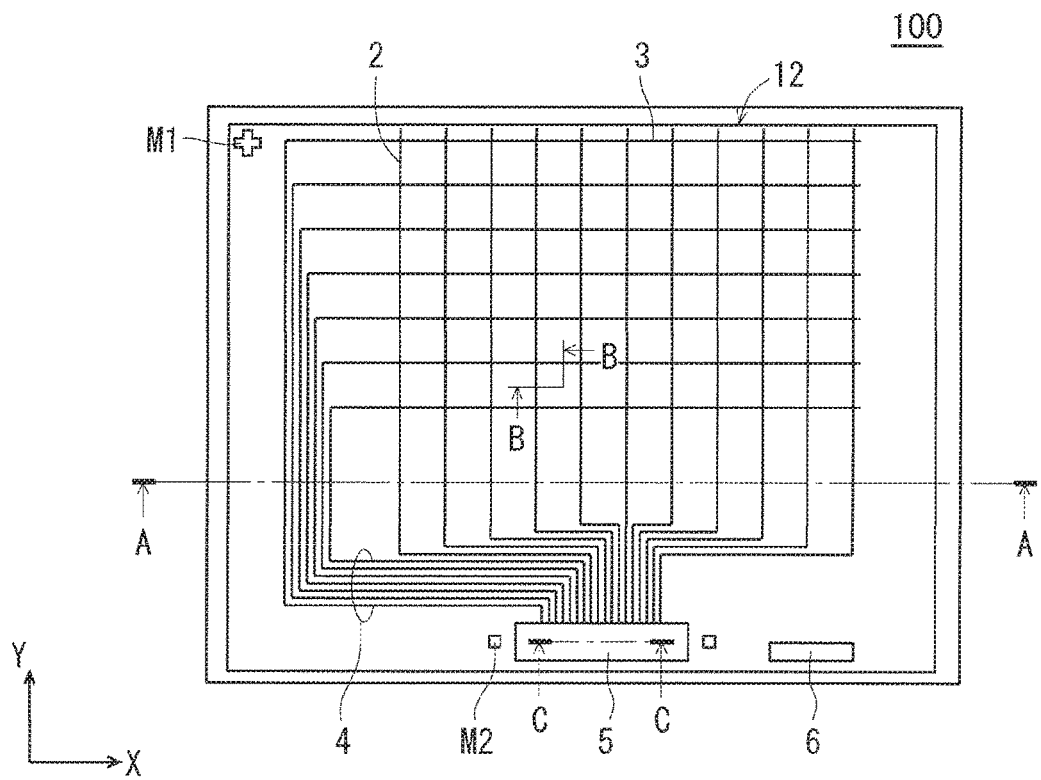
F I G . 2
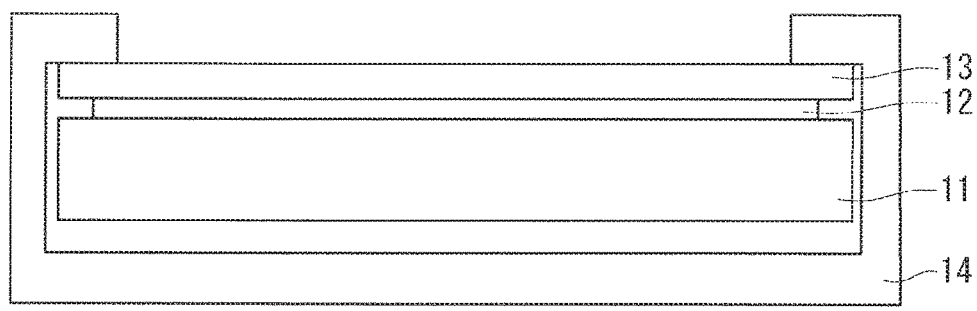

F I G. 3
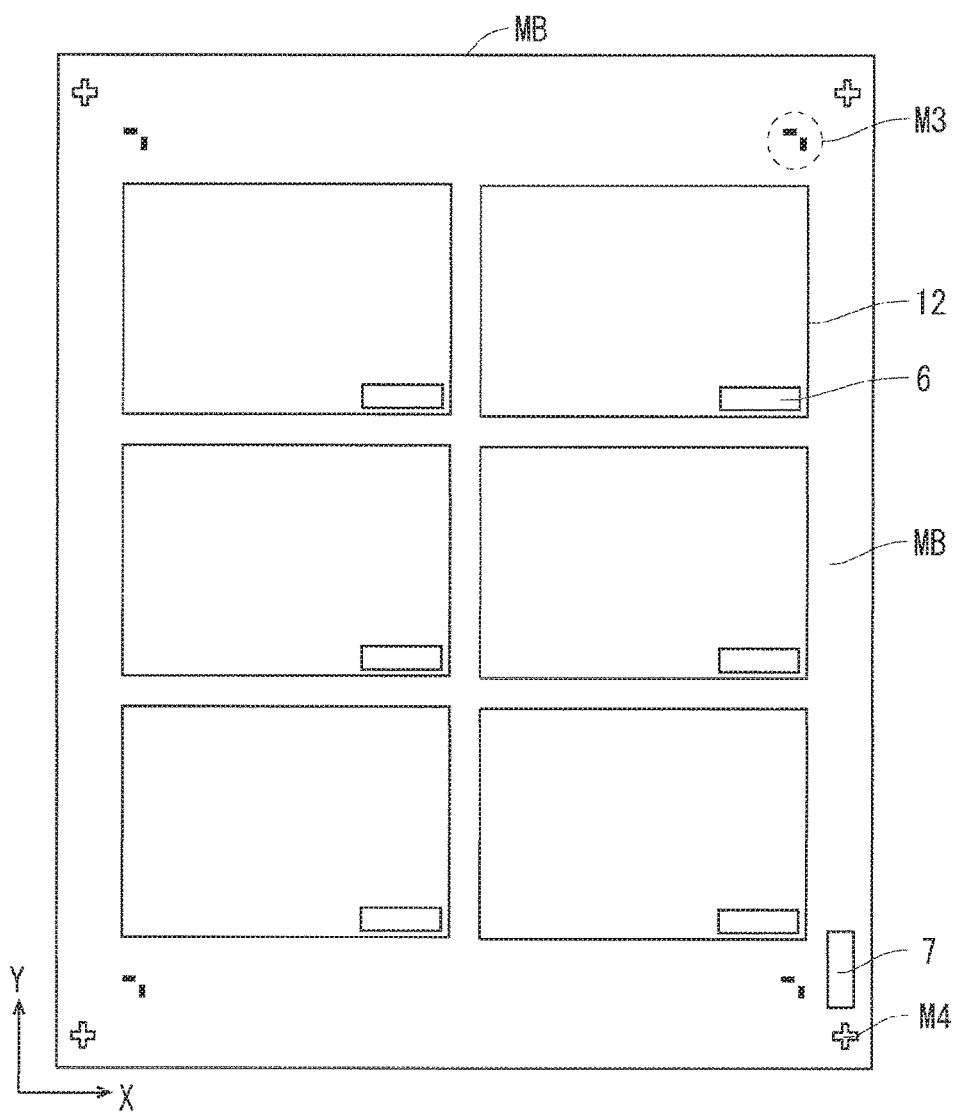

F I G . 4
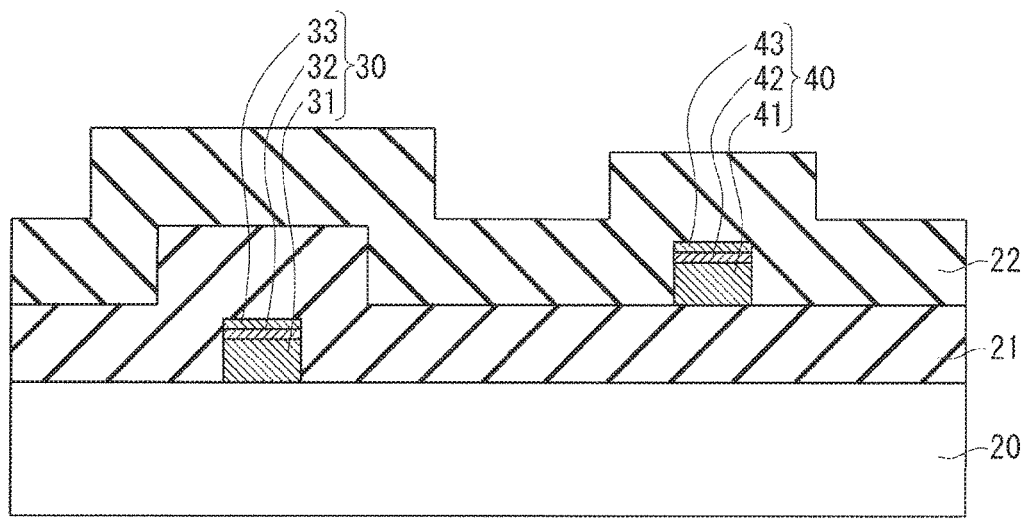
F I G . 5
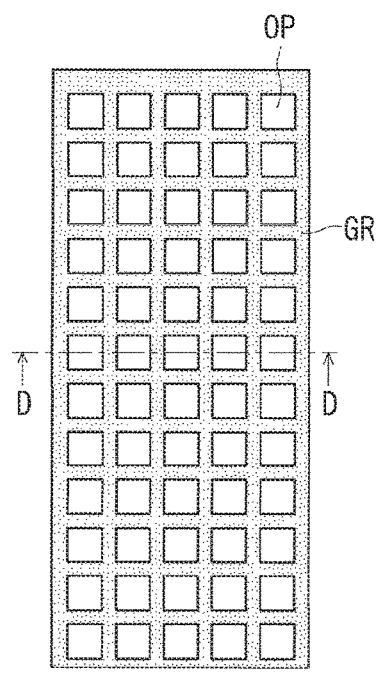

F I G. 6
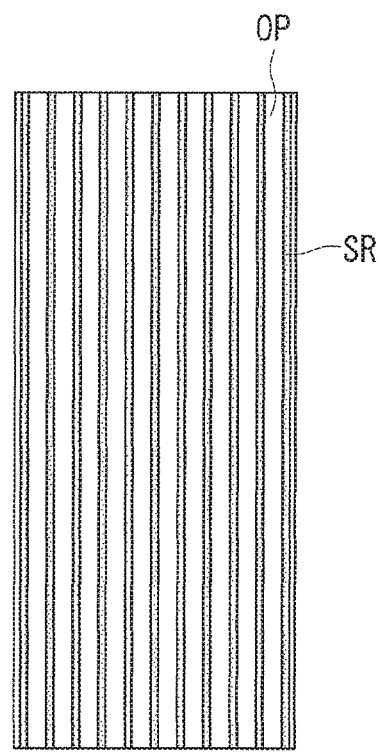
F I G. 7
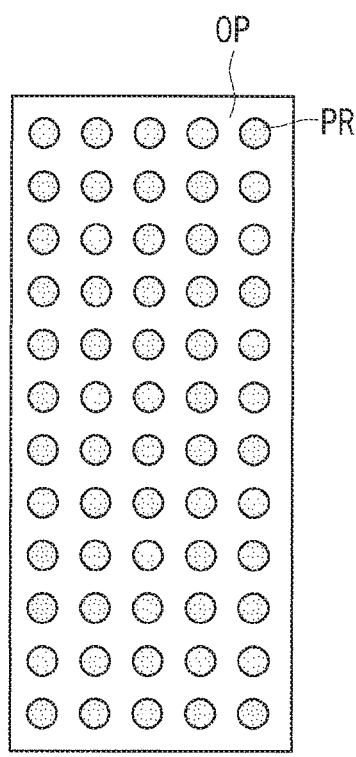

F I G . 1 3
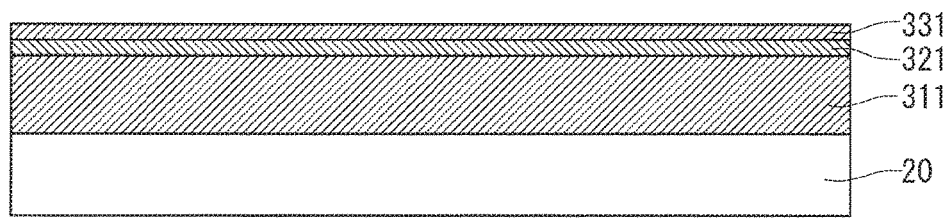
F I G . 1 4
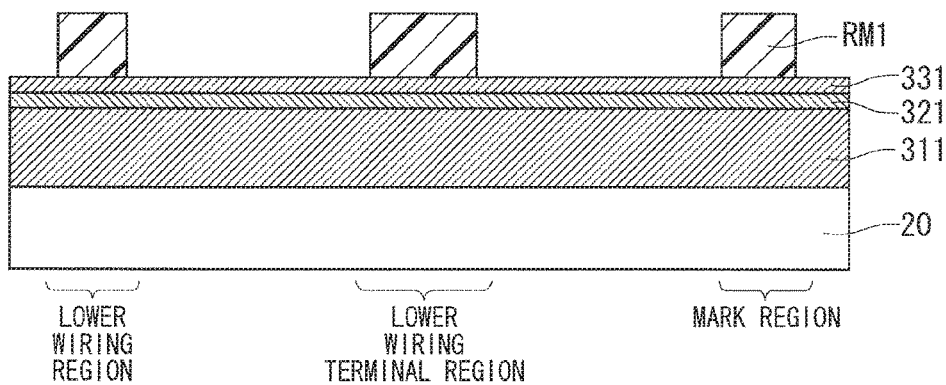
F I G . 1 5
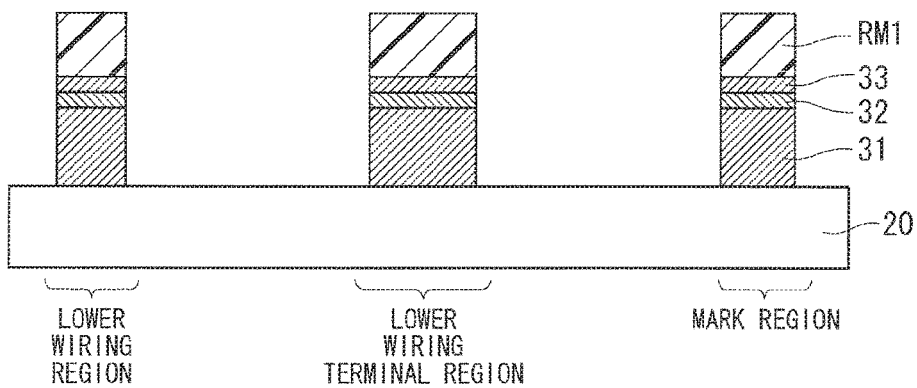

F I G . 2 0
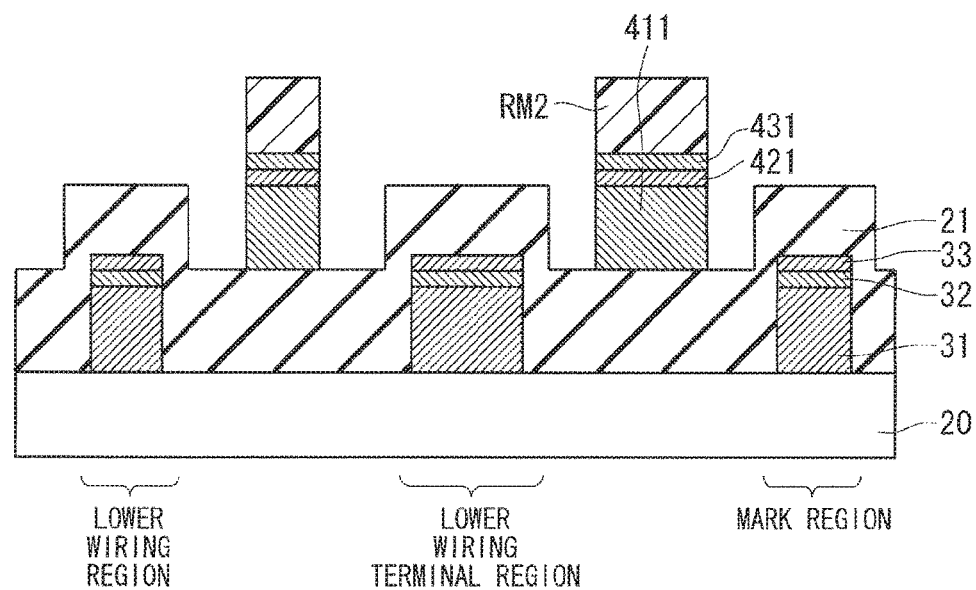
F I G . 2 1
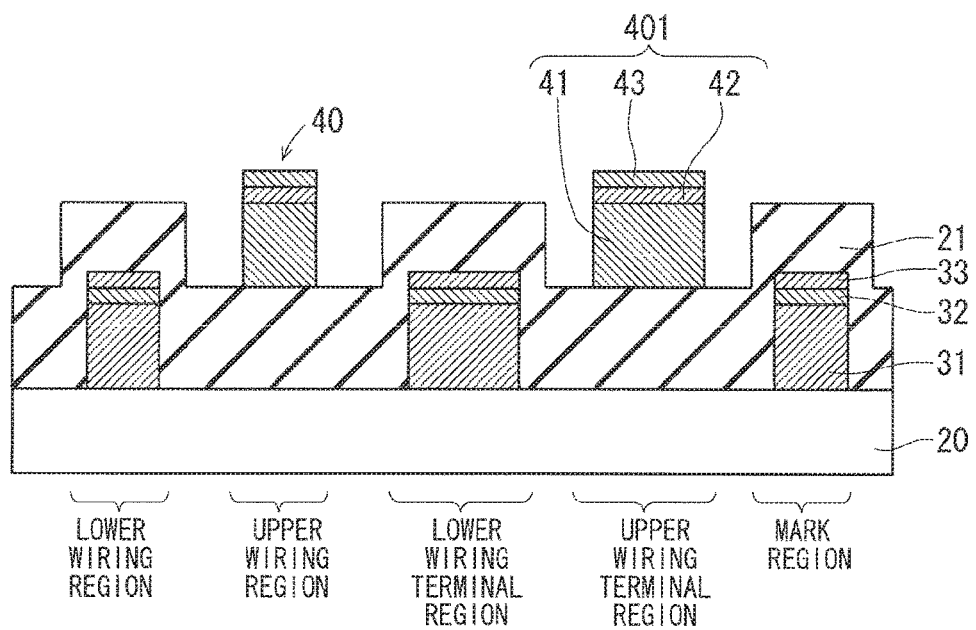

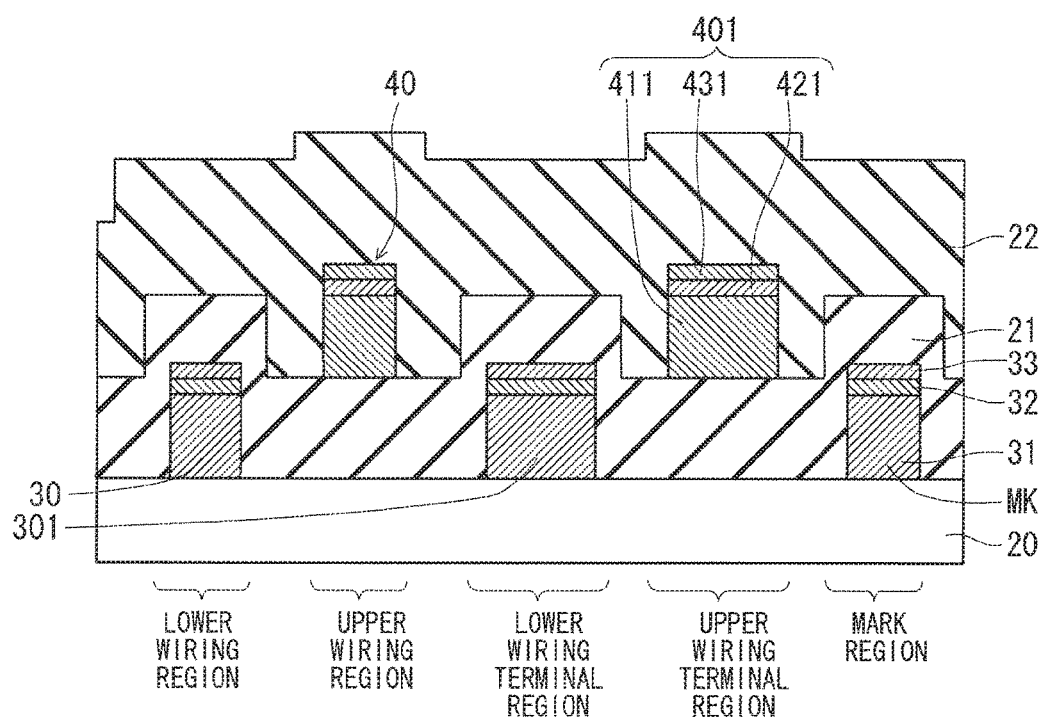

F I G. 2 4
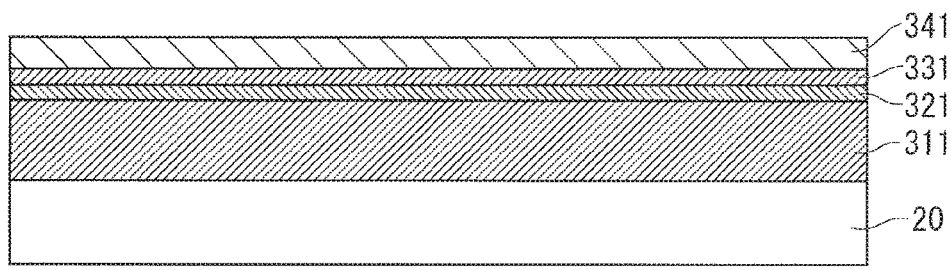
F I G. 2 5
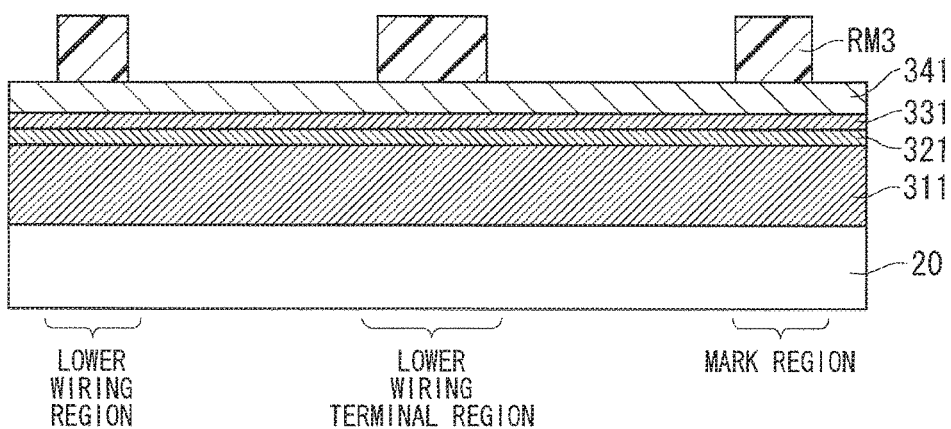
F I G. 2 6
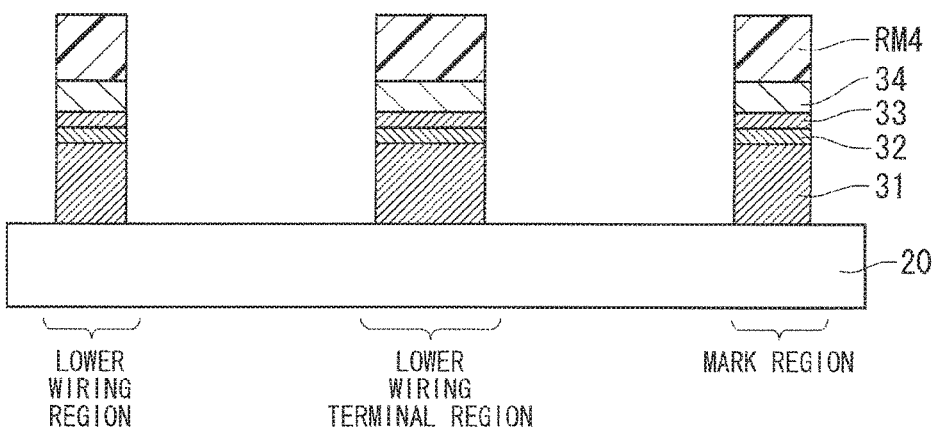

F I G . 3 7
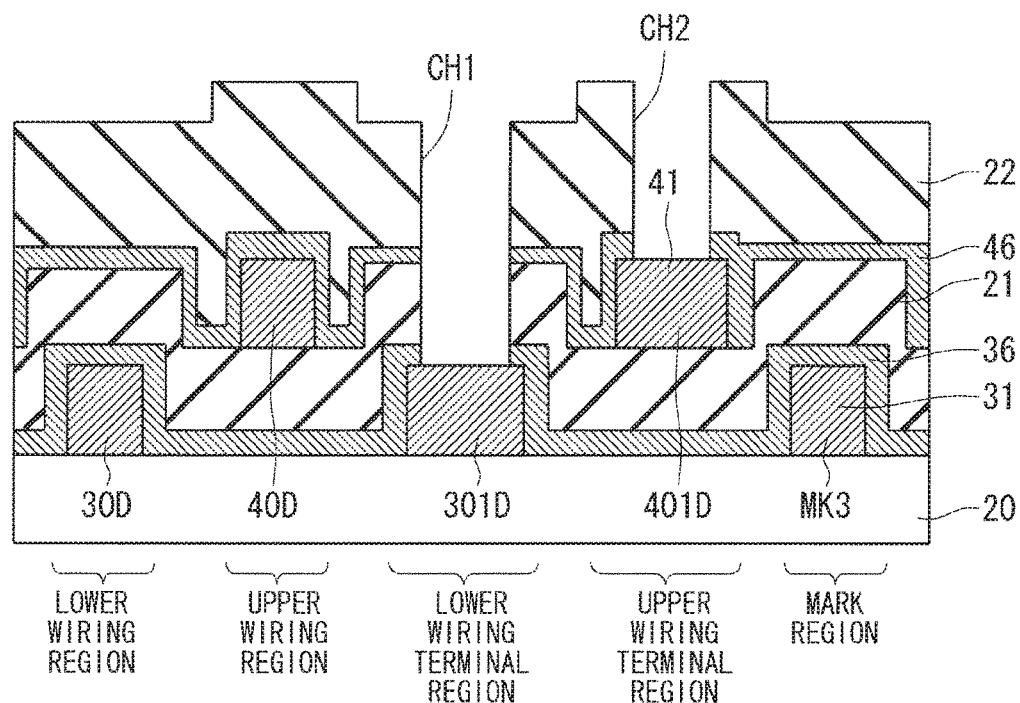
F I G . 3 8
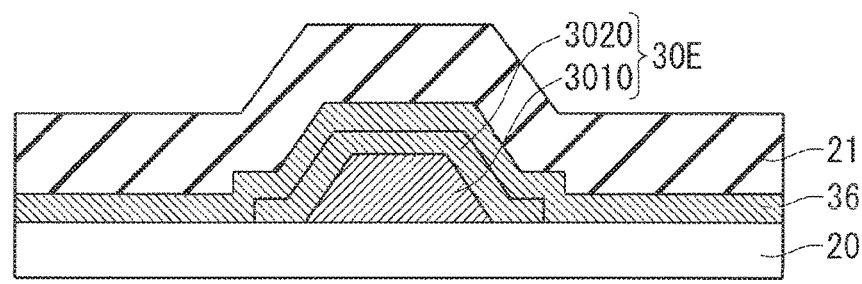

F I G . 3 9
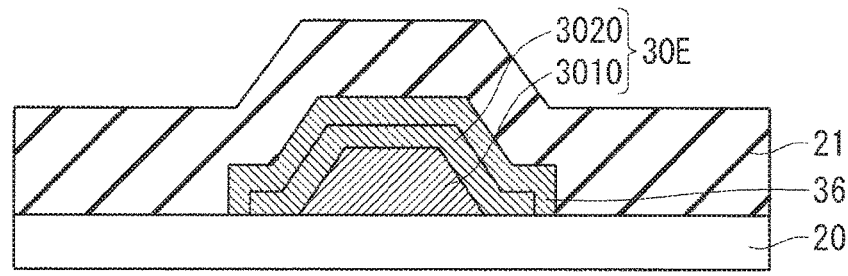
F I G . 4 0
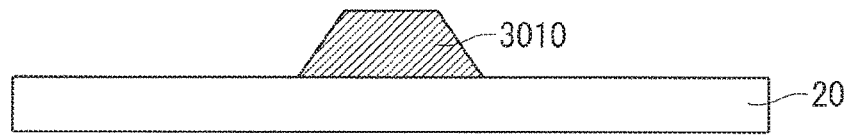
F I G . 4 1
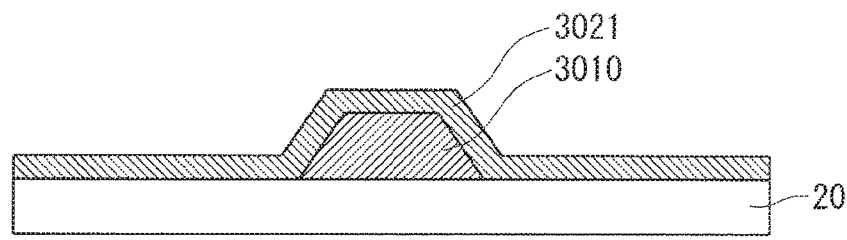
F I G . 4 2
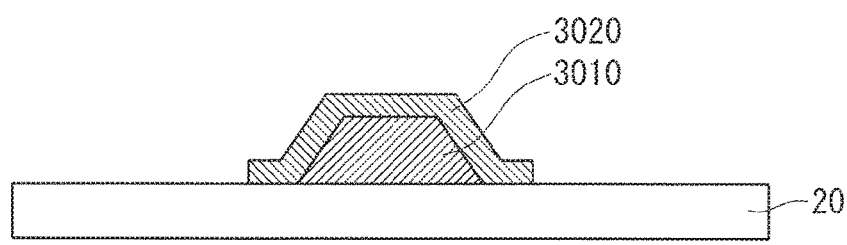

F I G. 4 3
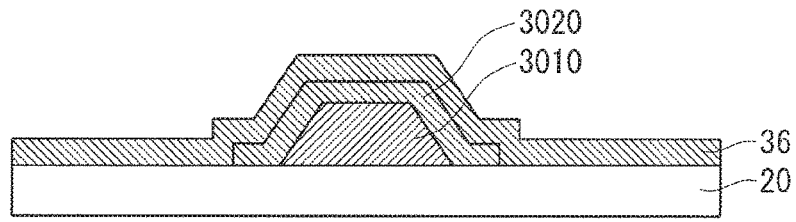
F I G. 4 4
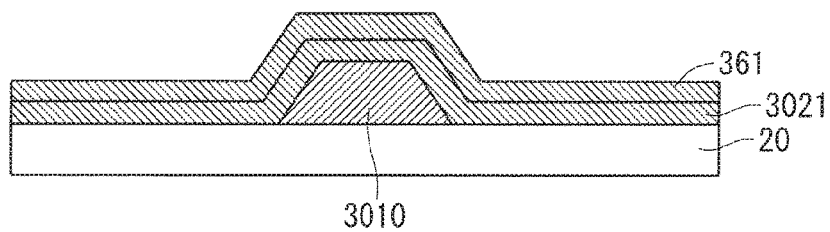
F I G. 4 5
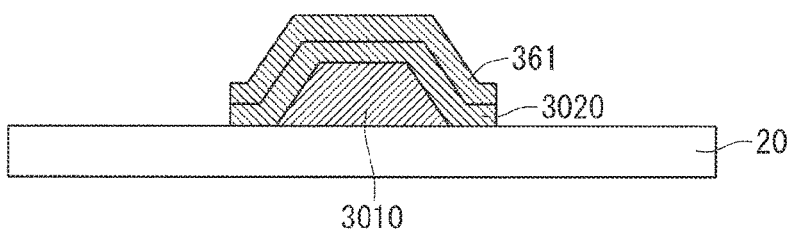
F I G. 4 6
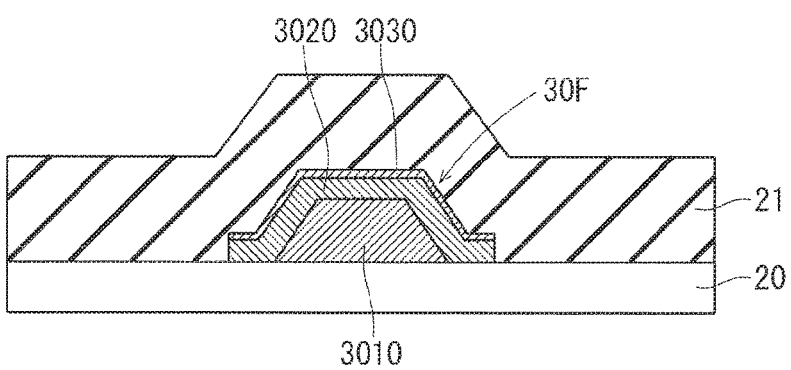

F I G . 4 7
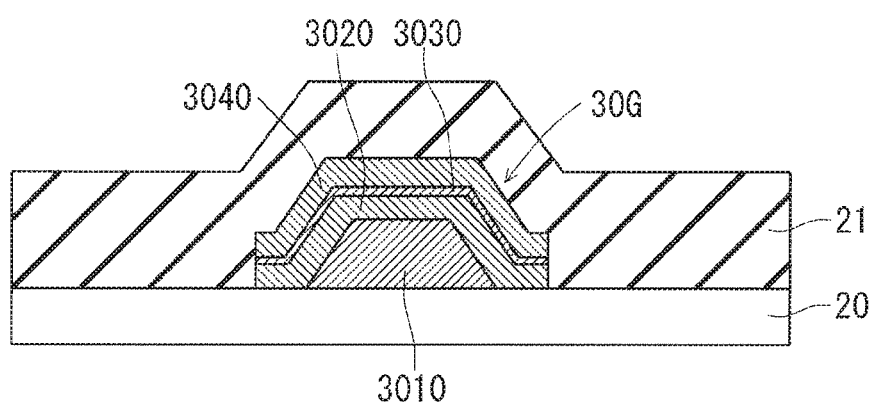

DISPLAY

CROSS REFERENCE TO RELATED APPLICATIONS

This application is a Continuation application of U.S. patent application Ser. No. 14/959,558, filed on Dec. 4, 2015, which is a Divisional application of U.S. patent application Ser. No. 14/046,782, filed on Oct. 4, 2013, which claims priority from Japanese Patent Application No. 2012-226843, filed on Oct. 12, 2012, the entire contents of which all are incorporated herein by reference.

FIELD OF THE INVENTION

The present invention relates to a display, and more specifically, to a display suitable for outdoor use.

BACKGROUND ART

A display to be used outdoors is required to achieve favorable display characteristics, even if it is used in an environment such as that in sunlight where the display receives a large amount of incident light from outside the display. Meanwhile, a wiring of the display is required to achieve a low resistance and required to be processed easily. An aluminum (Al) alloy responsive to these requirements has been used in many cases as a metal to form the wiring.

However, an aluminum alloy has a high reflectance. Hence, if the display is used in an environment where the display receives a large amount of incident light from outside the display, the incident light reflects off a wiring made of the aluminum alloy, failing to achieve favorable display characteristics.

In response, provision of an antireflection film on the aluminum alloy wiring has been considered with the intention of reducing reflection of light to enter the display from a display surface. As an example, Japanese Patent Application Laid-Open No. 2010-79240 discloses an antireflection film composed of an aluminum film and an aluminum nitride film.

Japanese Patent Application Laid-Open No. 2007-123672 discloses a conductor structure including an aluminum alloy film containing nickel and nitrogen as an upper film.

As described above, if the wiring is composed of a conductive film such as an aluminum alloy film, incident light reflects off a surface of the conductive film due to a high reflectance on the surface of the conductive film, failing to achieve favorable display characteristics.

SUMMARY OF THE INVENTION

It is an object of the present invention to provide a display that achieves excellent visibility of a display image even if the display is used outdoors.

According to an aspect of the present invention, the display includes: a laminated wiring with a conductive film arranged on a foundation layer, and a transparent film and a translucent film arranged on the conductive film; a wiring terminal part arranged at an edge portion of the laminated wiring and having a laminated structure being the same as at least that of the laminated wiring; and an insulating film that covers the laminated wiring and at least the wiring terminal part.

The aforementioned display includes the laminated wiring and the wiring terminal part each including the translucent film and the transparent film laminated on the conductive film. This suppresses reflection of light from a surface of the conductive film, thereby obtaining a display with excellent visibility.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing the structure of a touch panel of a display according to the present invention;

FIG. 2 is a sectional view of the display according to the present invention;

FIG. 3 shows an example of an array substrate;

FIG. 4 is a sectional view showing the structure of a touch panel according to a first preferred embodiment of the preset invention;

FIGS. 5 to 7 each show an example of a film pattern composed of a light-shielding part, a transmitting part and the like as a pattern for a translucent film;

FIGS. 13 to 22 are sectional views each showing a step of manufacturing the touch panel according to the first preferred embodiment of the present invention;

FIGS. 24 to 33 are sectional views each showing a step of manufacturing a touch panel according to a second preferred embodiment of the present invention;

FIGS. 37 to 39 are sectional views each showing the structure of a touch panel according to a fifth preferred embodiment of the present invention;

FIGS. 40 to 45 are sectional views each showing a step of manufacturing the touch panel according to the fifth preferred embodiment of the present invention; and FIGS. 46 and 47 are sectional views each showing the structure of the touch panel according to the fifth preferred embodiment of the preset invention.

EMBODIMENT FOR CARRYING OUT THE INVENTION

<Overall Structure of Display>

Figure 8:
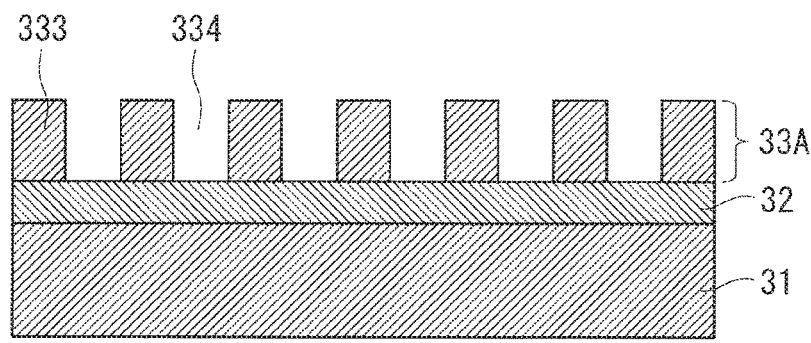
FIG. 8 is a sectional view showing a translucent film having a film pattern composed of a light-shielding part and a transmitting part.

FIG. 1 is a plan view showing a touch panel part of a display 100 according to the present invention. FIG. 2 is a sectional view of the display 100 taken along line A-A of the touch panel of FIG. 1.

The display 100 shown in FIGS. 1 and 2 is configured to allow input on the touch panel on the assumption that the display 100 is used outdoors, and has a pointing function realized with a finger, for example.

As shown in FIG. 2, the display 100 includes a display module 11 such as a liquid crystal display, a touch panel 12 arranged on a display surface of the display module 11, protection glass 13 that protects a surface of the touch panel 12 for example from a scratch, and a casing 14 that houses the display module 11, the touch panel 12, and the protection glass 13. If used in combination with a display module to form a GUI (graphical user interface) unit, the touch panel 12 can provide the display 100 with a pointing function.

The touch panel 12 is a projected capacitive touch panel. The touch panel 12 has a matrix pattern with X position detecting wirings 2 arranged so as to extend in a column direction (Y direction of FIG. 1), and Y position detecting wirings 3 arranged above the X position detecting wirings 2 so as to extend in a row direction (X direction of FIG. 1) and to cross the X position detecting wirings 2 in a grade separated manner. The X and Y position detecting wirings 2 and 3 are arranged on a transparent substrate made of glass or PET (polyethylene terephthalate), for example.

As shown in FIG. 1, the X and Y position detecting wirings 2 and 3 are electrically connected via lead wirings 4 to a terminal part 5 provided at an edge portion of the touch panel 12 for input and output of a signal to and from the outside. The touch panel 12 is electrically connected through the terminal part 5 to a control substrate and the like not shown in the drawings.

In preferred embodiments described later, the X position detecting wirings 2 are described as lower wirings (wirings close to the transparent substrate), and the Y position detecting wirings 3 are described as upper wirings. The X and Y position detecting wirings 2 and 3 may be reversed in terms of their relative vertical positions.

The touch panel 12 includes post-process recognition marks M1, FPC alignment marks M2, and a panel identification mark (panel ID) 6 and the like formed at respective positions of the touch panel 12. More specifically, in the example of FIG. 1, the post-process recognition marks M1 are formed at two upper corners in the Y direction of the touch panel 12, the FPC alignment marks M2 are formed at positions near opposite ends of the terminal part 5 extending in the X direction, and the panel ID 6 is formed at a lower edge portion in the Y direction of the touch panel 12.

The post-process recognition marks M1 are used in a step performed after the X and Y position detecting wirings 2 and 3 are formed. The FPC alignment marks M2 are used in aligning an FPC (flexible printed circuit) and the terminal part 5 when the FPC and the terminal part 5 are connected. The panel ID 6 is used for identification of the touch panel 12.

Regarding manufacture of touch panels or liquid crystal panels, multiple panels are formed in an array on one mother substrate, and these panels are subjected to the same step simultaneously. After a certain step is finished, the mother substrate is divided into the individual panels.

The aforementioned mother substrate on which multiple panels are arranged is called an array substrate. During a step performed on the array substrate, a panel is identified by a panel ID, and the array substrate is identified by a sheet ID given at any position of the array substrate.

FIG. 3 shows an example of the array substrate. In the example of FIG. 3, six touch panels 12 are formed on one mother substrate MB, with three touch panels 12 aligned in the Y direction and two touch panels 12 aligned in the X direction. The mother substrate MB includes, in addition to a sheet ID 7, alignment marks M3 and cutting marks M4 formed at respective positions of the mother substrate MB. The alignment marks M3 are used in photolithography process to be performed when an upper wiring pattern is laid on a lower wiring pattern, and in photolithography process to be performed when a terminal opening pattern is aligned with the lower and upper wiring patterns. The cutting marks M4 are used in dividing the mother substrate MB by cutting into the individual touch panels 12. More specifically, in the example of FIG. 3, the cutting marks M4 are formed at four corners of the mother substrate MB, the alignment marks M3 are formed near the four cutting marks M4, and the sheet ID 7 is formed near a cutting mark M4 at an edge portion in the X direction of the mother substrate MB and at a bottom portion in the Y direction of the mother substrate MB.

First Preferred Embodiment

A first preferred embodiment of the present invention is described next by referring to the structure in cross section of the touch panel 12. FIG. 4 shows the structure in cross section of the touch panel 12 taken along line B-B of FIG. 1.

As shown in FIG. 4, the touch panel 12 includes a transparent substrate 20 (corresponding to a mother substrate) made for example of glass or PET, a lower wiring 30 arranged on the transparent substrate 20, and an interlayer insulating film 21 arranged so as to cover the lower wiring 30. The lower wiring 30 is a laminated wiring composed of a conductive film 31, a transparent film 32, and a translucent film 33 laminated in this order. The lower wiring 30 corresponds to the X position detecting wiring 2 shown in FIG. 1. The transparent substrate 20 functions as a foundation for forming the lower wiring 30, so that it is also called a foundation layer in some cases.

An upper wiring 40 is arranged on the interlayer insulating film 21. The upper wiring 40 is a laminated wiring composed of a conductive film 41, a transparent film 42, and a translucent film 43 laminated in this order. A protection insulating film 22 is arranged so as to cover the upper wiring 40. The upper wiring 40 corresponds to the Y position detecting wiring 3 shown in FIG. 1. The interlayer insulating film 21 functions as a foundation for forming the upper wiring 40, so that it is also called a foundation layer in some cases.

The conductive film 31 is made of an Al-based alloy such as AlNiNd as a low-resistance material and has a thickness of 300 nm, for example.

The transparent film 32 is composed of an IZO (indium zinc oxide) film and has a thickness of 50 nm, for example. The translucent film 33 is composed of an Mo (molybdenum) film and has a thickness of 5 nm, for example. The interlayer insulating film 21 is composed of a silicon oxide ($SiO_2$) film and has a thickness of 600 nm, for example.

The conductive film 41 is made of an Al-based alloy such as AlNiNd as a low-resistance material and has a thickness of 400 nm, for example. The transparent film 42 is composed of an IZO film and has a thickness of 50 nm, for example. The translucent film 43 is composed of an Mo film and has a thickness of 5 nm, for example. The protection insulating film 22 is composed of a silicon oxide film and has a thickness of 300 nm, for example.

The conductive films 31 and 41 are made of a material having an average reflectance of 50% or more in a visible light region (from 380 nm to 780 nm) and a resistivity of 20 µΩcm or less at room temperature. The low-resistance material mentioned herein means a material having a resistivity of 10 µΩcm or less.

The conductive films 31 and 41 are each described as being made of AlNiNd in the aforementioned example. Each of the conductive films 31 and 41 may also be a laminated film of Al and a different Al-based alloy, a laminated film of Ag and an Ag-based alloy, a laminated film of Cu and a Cu-based alloy, a laminated film of Cr (chromium) and an Al-based alloy, or a laminated film of Mo and an Al-based alloy.

The transparent films 32 and 42 are each composed of a film having a transmittance of 70% or more in a visible light region.

The transparent films 32 and 42 are each described as a transparent film composed of an IZO film and having a thickness of 50 nm Such a transparent film is not the only example of the transparent films 32 and 42. Any transparent film adjusted so as to achieve an optical path length of from 0.09 to 0.14 μm can reduce reflection of light from the conductive films 31 and 41. The aforementioned adjustment of the optical path length can be realized by controlling a film thickness or by controlling a refractive index.

Regarding a material for the transparent films 32 and 42, a transparent conductive film made for example of ITO (indium tin oxide) achieves the same effect. A transparent insulating film made for example of SiN, $SiO_2$, $Al_2O_3$, transparent AlN, $Ta_2O_5$, $ZrO_2$, $Y_2O_3$, $HfO_2$, $Nb_2O_5$, or $TiO_2$ is also applicable.

The translucent films 33 and 43 are each described as an Mo film and having a thickness of 5 nm. Such an Mo film is not the only example of the translucent films 33 and 43. Any film adjusted so as to achieve a light transmittance of from 20% to 70% is applicable as the translucent films 33 and 43. Additionally, it is desirable that the translucent films 33 and 43 have a transmittance greater than a reflectance. By way of example, if the translucent films 33 and 43 are made of a metal such as Cr, Ti (titanium), Ni (nickel), Ta (tantalum), and W (tungsten), or an alloy mainly containing any of these metals listed here such as a Cr-based alloy, and have a thickness of from 2 to 7 nm, desirably from 5 to 6 nm, reflection of light from the conductive films 31 and 41 can be reduced.

If the touch panel 12 of FIG. 2 is turned upside down to make the rear surface of the touch panel 12 (surface of the transparent substrate 20 on which films are not laminated) become the front surface of the display 100, the vertical positions of the translucent film, the transparent film, and the conductive film forming the aforementioned laminated structure are changed relative to each other. In this case, by laminating the translucent film, the transparent film, and the conductive film in this order as viewed from a foundation layer, reflection of light to enter from the front surface of the display 100 corresponding to the rear surface of the touch panel 12, namely, light to enter from the foundation layer can be reduced.

As described above, turning the touch panel 12 upside down changes the vertical positions of the films in the laminated structure relative to each other, and this is also applicable to the case where films in the laminated structure are formed on the protection glass 13. More specifically, laminating the translucent film, the transparent film, and the conductive film in this order on a surface of the protection glass 13 opposite the front surface of the display 100 can also reduce reflection of light to enter from the foundation layer.

The upper wiring 40 functioning as the Y position detection wiring has a length greater than that of the lower wiring 30. Hence, for reduction in wiring resistance, the conductive film 41 of the upper wiring 40 is formed to a thickness greater than that of the conductive film 31 of the lower wiring 30 as described above. However, the respective conductive films of the lower and upper wirings 30 and 40 may have thicknesses arbitrarily determined based on required resistance values.

The thickness of the interlayer insulating film 21 can be determined arbitrarily based on a desired electrostatic capacitance, for example. The thickness of the protection insulating film 22 can be determined based on a selection ratio between a resist and the protection insulating film 22 determined for dry etching process and time of the dry etching process, for example. Meanwhile, a greater thickness of the interlayer insulating film 21 is likely to reduce a difference in color tone and reflectance between the interlayer insulating film 21 and the lower wiring 30. Thus, if possible, the thickness of the interlayer insulating film 21 is determined to be about 1 and more desirably, to be 1.3 μm or more.

The interlayer insulating film 21 and the protection insulating film 22 are each described as a silicon oxide film in the aforementioned example. However, a silicon oxide film is not the only example. Each of the interlayer insulating film 21 and the protection insulating film 22 may also be an SOG (spin on glass) film formed by coating, as long as such a film does not generate undesirable coloring of light to pass through a light-transmitting part except a wiring part. Using an SOG film as an interlayer insulating film also achieves the effect of suppressing a short-circuit to be generated at an intersection of an upper wiring and a lower wiring.

The translucent films 33 and 43 are not required to be uniform in thickness, as long as they have a transmittance of from 20% to 70%. By way of example, the translucent films 33 and 43 may have a film pattern composed of a light-shielding part and a transmitting part. FIGS. 5 to 7 show examples of such a film pattern.

FIG. 5 shows a grid film pattern. The light-shielding part is composed of a grid GR, the transmitting part is composed of opening parts OP, and the grid GR is formed such that a ratio of the opening parts OP is from 20% to 70%. As a result, a translucent film having a transmittance of from 20% to 70% is obtained.

FIG. 6 shows a strip film pattern. The light-shielding part is composed of stripes SR, the transmitting part is composed of opening parts OP in the shape of slits, and the stripes SR are formed such that a ratio of the opening parts OP is from 20% to 70%. As a result, a translucent film having a transmittance of from 20% to 70% is obtained.

FIG. 7 shows a dotted film pattern. The light-shielding part is composed of dots PR, the transmitting part is composed of an opening part OP other than the dots PR, and the dots PR are formed such that a ratio of the opening part OP is from 20% to 70%. As a result, a translucent film having a transmittance of from 20% to 70% is obtained.

FIG. 8 shows a structure in cross section taken along line D-D of FIG. 5. As shown in FIG. 8, a translucent film 33A is composed of light-shielding parts 333 formed on the transparent film 32 to be spaced from each other, and transmitting parts 334 defined between the light-shielding parts 333. In the grid film pattern of FIG. 5, the light-shielding parts 333 correspond to the grid GR, and the transmitting parts 334 correspond to the opening parts OP. The structure in cross section of FIG. 8 is also applied to the patterns of FIGS. 6 and 7.

The film patterns described by referring to FIGS. 5 to 7 are each composed of a combination of a light-shielding part and a transmitting part. A film pattern may also be composed of a combination of a light-shielding part and a translucent part such as that shown in FIG. 9, or a combination of a transmitting part and a translucent part such as that shown in FIG. 10.

Figure 9:
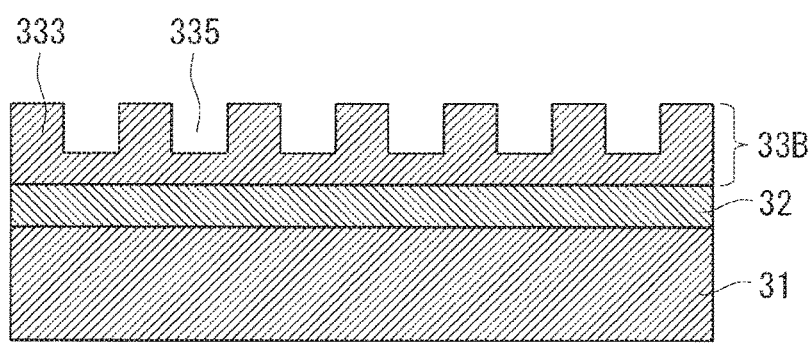
FIGS. 9 and 10 are sectional views each showing a translucent film having a film pattern composed of a light-shielding part and a translucent part.

More specifically, referring to FIG. 9, a translucent film 33B is composed of light-shielding parts 333 formed on the transparent film 32 to be spaced from each other, and translucent parts 335 defined between the light-shielding parts 333 and thinner than the light-shielding parts 333. In the grid film pattern of FIG. 5, the light-shielding parts 333 correspond to the grid GR, and the translucent parts 335 correspond to the opening parts OP.

Figure 10:
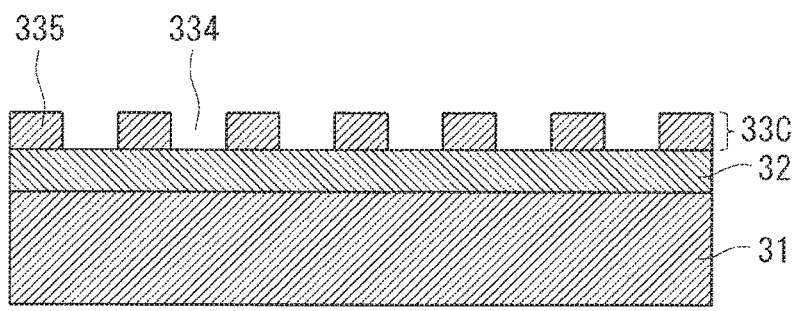

Referring to FIG. 10, a translucent film 33C is composed of translucent parts 335 formed on the transparent film 32 to be spaced from each other, and transmitting parts 334 defined between the translucent parts 335. In the grid film pattern of FIG. 5, the translucent parts 335 correspond to the grid GR, and the transmitting parts 334 correspond to the opening parts OP.

The light-shielding part mentioned herein means a part having a transmittance of 20% or less. The transmitting part mentioned herein means a part having a transmittance of 70% or more. The translucent part mentioned herein means a part having a transmittance of from 20% to 70%.

Figure 11:
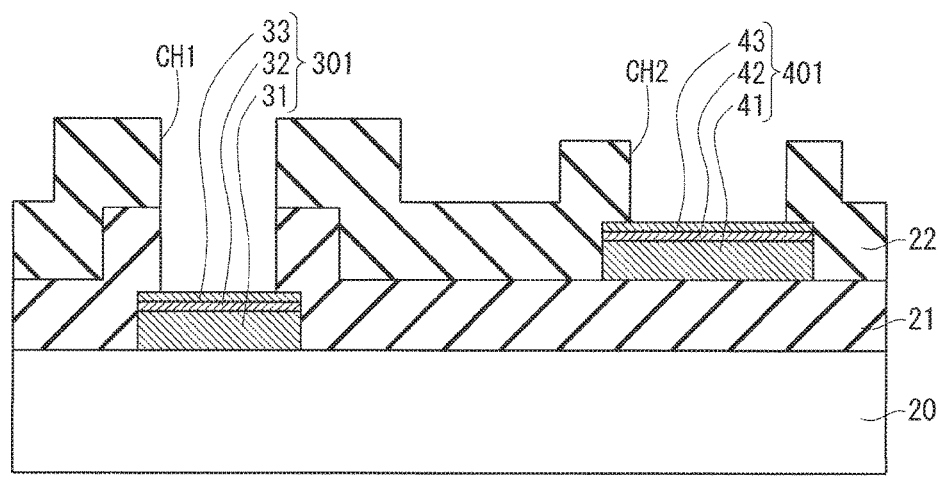
FIGS. 11 and 12 each show the structure in cross section of a terminal part of the touch panel.

FIG. 11 shows the structure in cross section of the terminal part 5 of the touch panel 12 taken along line C-C of FIG. 1. The terminal part 5 includes a lower wiring terminal 301 to be connected to the lower wiring 30, and an upper wiring terminal 401 to be connected to the upper wiring 40. The lower wiring terminal 301 is formed in the same step as the lower wiring 30, whereas the upper wiring terminal 401 is formed in the same step as the upper wiring 40.

As shown in FIG. 11, the lower wiring terminal 301 is a laminated wiring composed of the conductive film 31, the transparent film 32, and the translucent film 33 laminated in this order on the transparent substrate 20. A contact hole CH1 is formed so as to penetrate the interlayer insulating film 21 and the protection insulating film 22 existing above the lower wiring terminal 301. A contact hole is also called an opening part.

The upper wiring terminal 401 is a laminated wiring composed of the conductive film 41, the transparent film 42, and the translucent film 43 laminated in this order on the interlayer insulating film 21. A contact hole CH2 is formed so as to penetrate the protection insulating film 22 existing above the upper wiring terminal 401. The terminal part 5 is electrically connected via the contact holes CH1 and CH2 and an FPC to a control substrate, for example.

By using an Al alloy containing Ni as a material for the conductive films 31 and 41 and forming the transparent films 32 and 42 as transparent conductive films made for example of IZO, increase in contact resistance between the conductive film and the transparent film above the conductive film can be suppressed.

By forming the transparent films 32 and 42 as transparent conductive films made for example of IZO and using Mo as a material for the translucent films 33 and 43, increase in contact resistance between the transparent conductive film and the translucent film can be suppressed. This can also reduce a contact resistance regarding connection via an FPC using an ACF (anisotropic conductive film), without the need of eliminating the translucent film and the transparent film in the opening part of the terminal part 5.

A contact resistance may be increased depending on a combination of the translucent film and the transparent film to be selected. In this case, a contact resistance between the FPC and the terminal can be reduced by the structure of FIG. 12 where the translucent films and the transparent films are removed.

Figure 12:
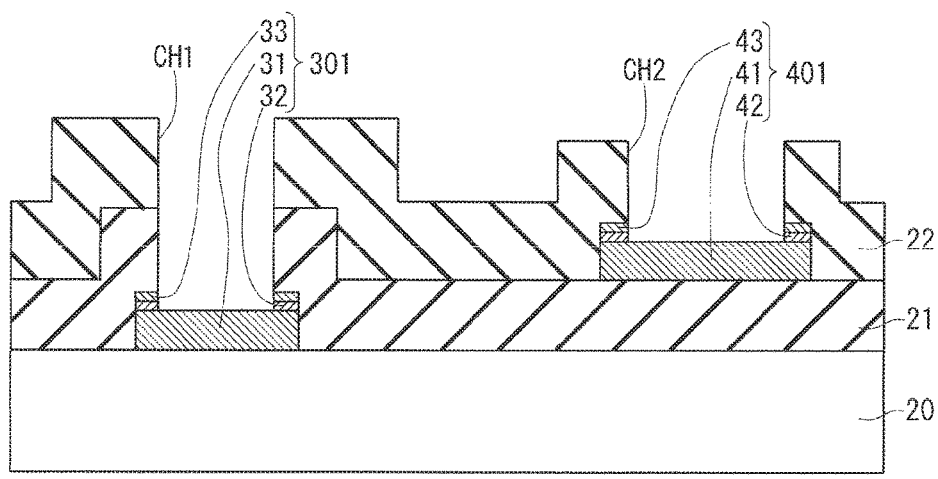

More specifically, in the structure of FIG. 12, the contact hole CH1 penetrating the interlayer insulating film 21 and the protection insulating film 22 existing above the lower wiring terminal 301 further penetrates the transparent film 32 and the translucent film 33 to reach the conductive film 31. Further, the contact hole CH2 penetrating the protection insulating film 22 existing above the upper wiring terminal 401 further penetrates the transparent film 42 and the translucent film 43 to reach the conductive film 41.

This structure allows increase of the S/N ratio of a signal and provides a stable contact resistance of the terminal, thereby enhancing reliability.

As described above, by forming the wiring as a laminated film composed of the conductive film, the transparent film, and the translucent film, light having entered from outside and to be emitted after having passed through the translucent film and reflected off the conductive film, and light to reflect off a surface of the translucent film, can be cancelled out by optical interference effect. This reduces reflection in the wiring, thereby providing enhanced visibility of representation on the display.

The conductive film is not always made of an Al-based alloy, but conductive films formed in various processes are applicable. Additionally, using IZO hard to crystallize as a material for the transparent film allows the transparent film to be processed easily. During process, the transmittance of the IZO hard to crystallize does not change seriously compared to ITO that is easy to crystallize. By using Mo as a material for the translucent film, fluctuations in in-plane reflectance are suppressed, thereby achieving a display having a uniform reflectance in a display surface and a low-reflection wiring. The laminate of the transparent film and the translucent film suppresses reflection as a result of optical interference effect, so that it can be called a reflection suppressing film.

A method of manufacturing the display according to the first preferred embodiment of the present invention is described next by referring to the sectional views of FIGS. 13 to 22 showing steps of manufacturing the touch panel 12 in order.

First, in the step shown in FIG. 13, by using an AlNiNd target, an AlNiNd film 311 is deposited by sputtering process on the transparent substrate 20 made of glass, PET or the like to a thickness of 300 nm. Then, an IZO film 321 is deposited by sputtering process on the AlNiNd film 311 to a thickness of 50 nm. Then, an Mo film 331 is deposited by sputtering process on the IZO film 321 to a thickness of 5 nm.

Next, a resist material is applied on the Mo film 331, and then patterns for a lower wiring, a lower wiring terminal, and a mark are exposed and developed, thereby patterning a resist mask RM1 having the patterns for the lower wiring, the lower wiring terminal, and the mark group (including a mark and an ID, for example) as shown in FIG. 14. In the drawings mentioned below, a region where the lower wiring is formed is called a lower wiring region, a region where the lower wiring terminal is formed is called a lower wiring terminal region, and a region where the mark group is formed is called a mark region. The lower wiring region, the lower wiring terminal region, and the mark region are illustrated as being formed in a line in FIGS. 14 to 22. This way of illustration is merely for the sake of convenience and is intended to facilitate understanding of the idea of the invention.

Next, as shown in FIG. 15, by using the resist mask RM1 as an etching mask, the Mo film 331 is etched for example with mixed acid of phosphoric acid, nitric acid, and acetic acid. Next, the IZO film 321 is etched with an oxalic acid solution, thereby patterning the translucent film 33 and the transparent film 32. Then, the AlNiNd film 311 is etched for example with mixed acid of phosphoric acid, nitric acid, and acetic acid to pattern the conductive film 31.

Figure 16:
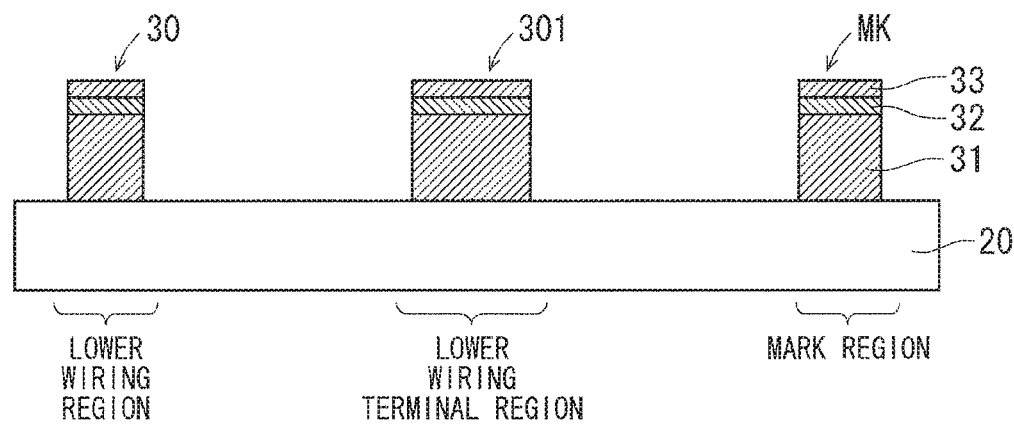

Next, the resist mask RM1 is removed with a resist stripping liquid such as a mixed liquid of monoethanolamine and dimethyl sulfoxide, thereby forming the lower wiring 30, the lower wiring terminal 301, and a mark group MK shown in FIG. 16.

Figure 17:
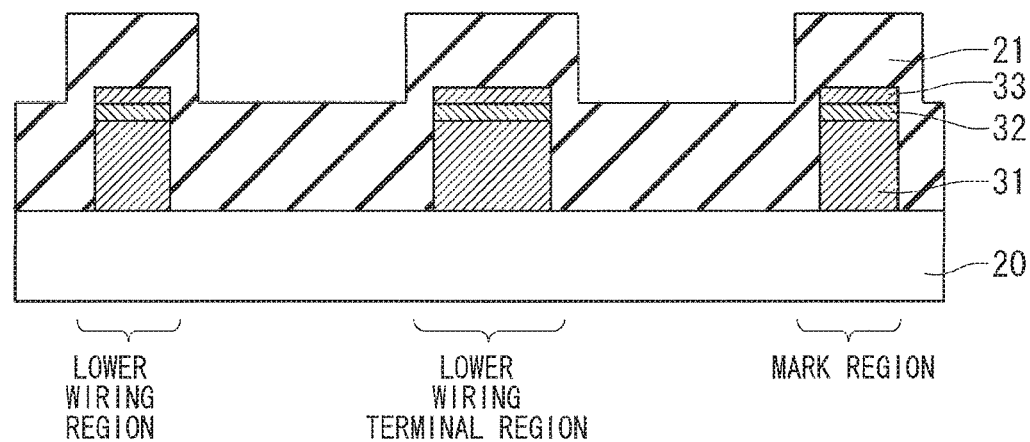

Next, as shown in FIG. 17, a silicon oxide film is deposited for example by CVD (chemical vapor deposition) process to a thickness of about 600 nm so as to cover the lower wiring 30, the lower wiring terminal 301, and the mark group MK, thereby forming the interlayer insulating film 21.

Figure 18:
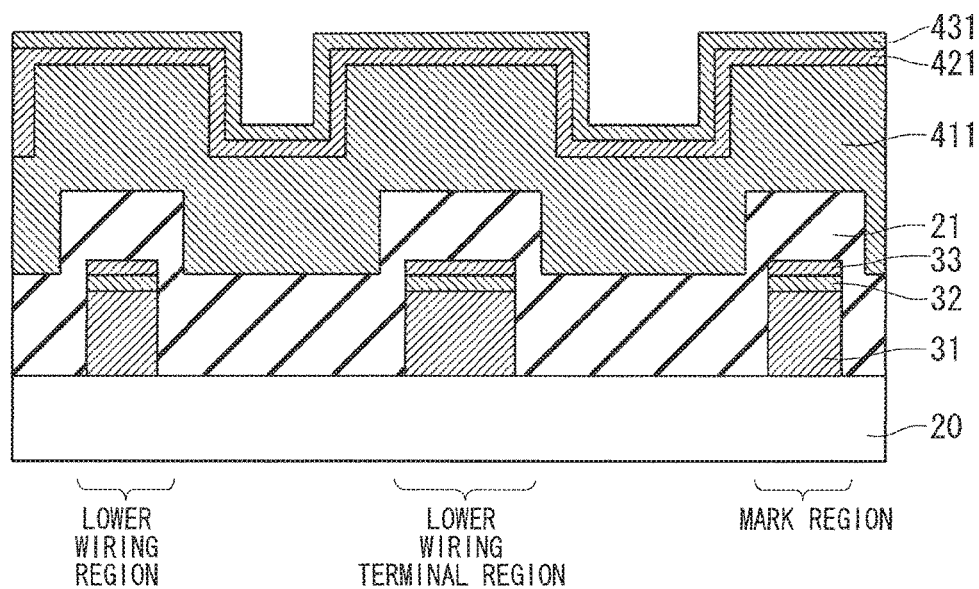

Next, as shown in FIG. 18, by using an AlNiNd target, an AlNiNd film 411 is deposited by sputtering process on the interlayer insulating film 21 to a thickness of 400 nm. Then, an IZO film 421 is deposited by sputtering process on the AlNiNd film 411 to a thickness of 50 nm. Then, an Mo film 431 is deposited by sputtering process on the IZO film 421 to a thickness of 5 nm.

Figure 19:
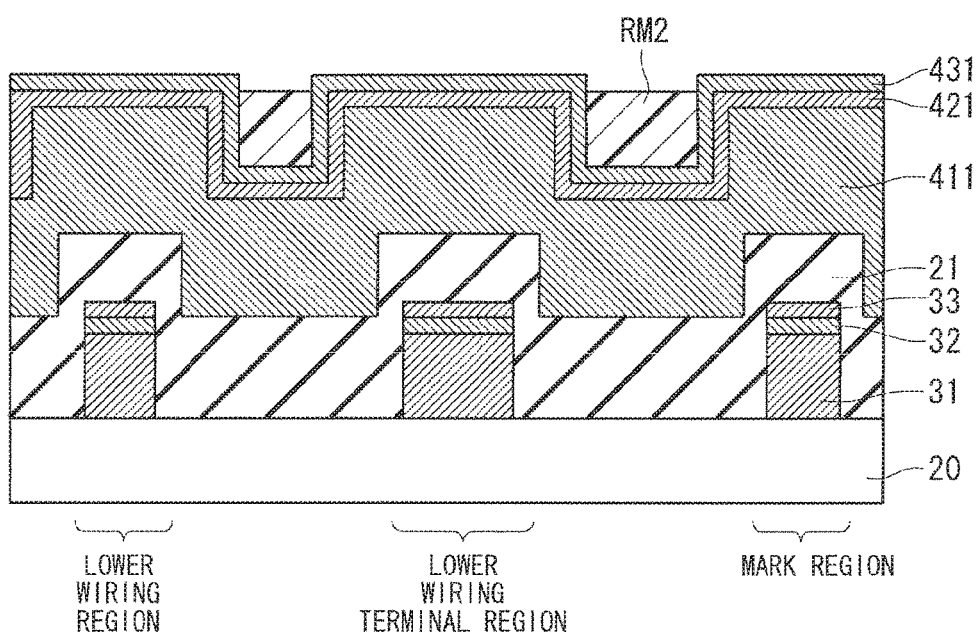

Next, a resist material is applied on the Mo film 431, and then patterns for an upper wiring and an upper wiring terminal are exposed and developed, thereby patterning a resist mask RM2 having the patterns for the upper wiring and the upper wiring terminal as shown in FIG. 19.

Next, as shown in FIG. 20, by using the resist mask RM2 as an etching mask, the Mo film 431 is etched for example with mixed acid of phosphoric acid, nitric acid, and acetic acid. Next, the IZO film 421 is etched with an oxalic acid solution, thereby patterning the translucent film 43 and the transparent film 42. Then, the AlNiNd film 411 is etched for example with mixed acid of phosphoric acid, nitric acid, and acetic acid to pattern the conductive film 41.

Next, the resist mask RM2 is removed with a resist stripping liquid such as a mixed liquid of monoethanolamine and dimethyl sulfoxide, thereby forming the upper wiring 40 and the upper wiring terminal 401 shown in FIG. 21. In the drawings mentioned below, a region where the upper wiring is formed is called an upper wiring region and a region where the upper wiring terminal is formed is called an upper wiring terminal region.

Next, as shown in FIG. 22, an SiO$_2$ film is deposited for example by CVD process to a thickness of about 300 nm so as to cover the upper wiring 40 and the upper wiring terminal 401, thereby forming the protection insulating film 22.

Then, a resist material is applied on the protection insulating film 22. Next, opening patterns for the lower wiring terminal 301, the upper wiring terminal 401, and the mark group MK are exposed and developed, thereby patterning a resist mask (not shown in the drawings) having the opening patterns for the lower and upper wiring terminals 301 and 401. Next, by using this resist mask as an etching mask, the protection insulating film 22 and the interlayer insulating film 21 existing above the lower wiring terminal 301 are removed by dry etching, thereby forming the contact hole CH1 reaching the translucent film 33. Further, the protection insulating film 22 existing above the upper wiring terminal 401 is removed to form the contact hole CH2 reaching the translucent film 43. As a result, a touch panel including the wirings of FIG. 4 and the wiring terminals of FIG. 11 is formed.

The aforementioned manufacturing method allows formation of the low-reflection wirings, wiring terminals, and mark group without involving an additional step.

After the wirings and the wiring terminals are formed, a mother substrate is divided for example by scribing process with a wheel cutter or laser cutting process with laser light into individual touch panels.

Figure 23A:
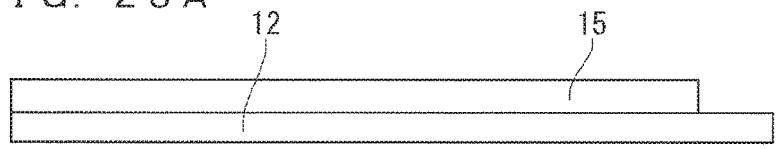
FIGS. 23A to 23D each show a step of assembling the display.

Next, a display is assembled by following the steps shown in FIGS. 23A to 23D. More specifically, as shown in FIG. 23A, after the panel is cleaned, a surface protection sheet 15 for protecting the touch panel 12 from a scratch during mounting is bonded to a touch-sensitive surface of the touch panel 12. A protection sheet may further be bonded to a surface of the touch panel 12 opposite the touch-sensitive surface.

Figure 23B:
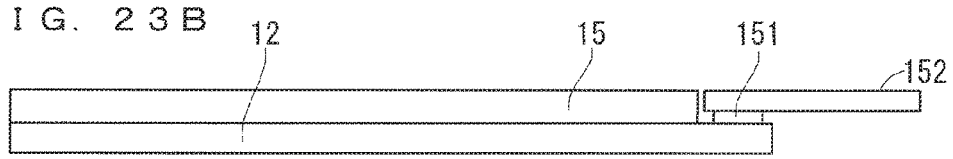

Next, as shown in FIG. 23B, an ACF 151 is arranged on the wiring terminal, and an FPC 152 is mounted by thermal compression bonding.

Figure 23C:

Next, the surface protection sheet 15 is peeled off the touch panel 12. Then, as shown in FIG. 23C, a two-sided adhesive sheet 16 is attached to the touch panel 12, and the protection glass 13 is adhesively connected to the touch panel 12 via the two-sided adhesive sheet 16.

Figure 23D:
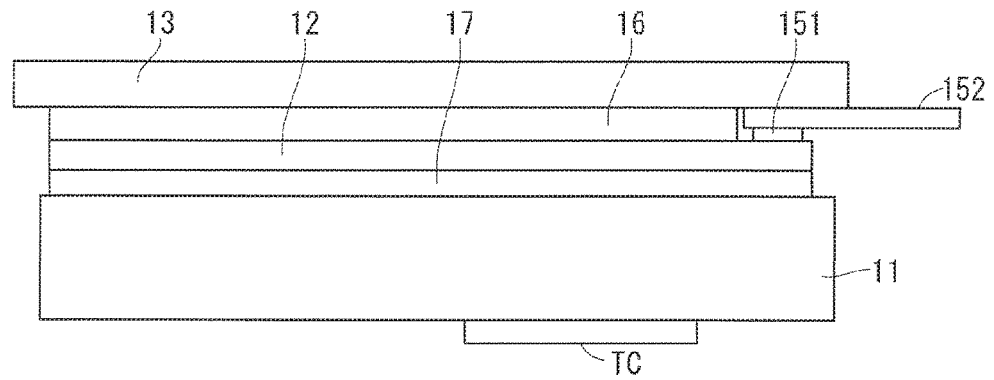

Next, as shown in FIG. 23D, a two-sided adhesive sheet 17 is attached to the rear surface (surface opposite the touch-sensitive surface) of the touch panel 12, and the display module 11 is adhesively connected to the touch panel 12 via the two-sided adhesive sheet 17. If a protection sheet is bonded to the surface of the touch panel 12 opposite the touch-sensitive surface, this protection sheet is peeled before attachment of the two-sided adhesive sheet 17.

Although not shown in the drawings, the FPC 152 mounted on the touch panel 12 is connected to a connector of a touch panel control substrate TC arranged on the back surface of the display module 11. Then, the aforementioned components are assembled into the casing to obtain the display 100 shown in FIG. 2.

As described above, the display module 11 is arranged on the rear surface of the touch panel 12, and external light enters the display 100 from a side opposite the display module 11. Meanwhile, as a result of the presence of the low-reflection wiring on the front surface of the touch panel 12, reflection of external light incident on a surface of the conductive film is suppressed. As a result, a display having excellent visibility is obtained.

The aforementioned steps are not the only steps of the manufacturing method of the present invention. By way of example, if the rear surface of the touch panel is formed as a low-reflection surface, protection glass can become unnecessary. Or, two touch panels can be prepared and adhesively connected.

Second Preferred Embodiment

A second preferred embodiment of the present invention is described next by referring to FIGS. 24 to 28. Structures corresponding to those appearing in the manufacturing method of the first preferred embodiment described by referring to FIGS. 13 to 22 are identified by the same reference numbers, and will not be described repeatedly for the same purpose.

First, in the step shown in FIG. 24, by using an AlNiNd target, an AlNiNd film 311 to become a conductive film is deposited by sputtering process on a transparent substrate 20 to a thickness of 300 nm. Then, an ITO film 321 to become a transparent film is deposited by sputtering process on the AlNiNd film 311 to a thickness of 60 nm. Then, a Cr film 331 to become a translucent film is deposited by sputtering process on the ITO film 321 to a thickness of 5 nm. Next, an Mo film 341 to become a non low-reflection film is deposited by sputtering process on the Cr film 331 to a thickness of 10 nm.

Next, a resist material is applied on the Mo film 341, and then patterns for a lower wiring, a lower wiring terminal, and a mark are exposed and developed, thereby patterning a resist mask RM3 having the patterns for the lower wiring, the lower wiring terminal, and the mark group (including a mark and an ID, for example) as shown in FIG. 25.

Next, as shown in FIG. 26, by using the resist mask RM3 as an etching mask, the Mo film 341 is etched for example with mixed acid of phosphoric acid, nitric acid, and acetic acid. Next, the Cr film 331 is etched with a mixed liquid of nitric acid and ceric ammonium nitrate. Then, the ITO film 321 is etched with an oxalic acid solution, thereby patterning a non low-reflection film 34, a translucent film 33, and a transparent film 32. Then, the AlNiNd film 311 is etched for example with mixed acid of phosphoric acid, nitric acid, and acetic acid to pattern a conductive film 31.

Figure 27:
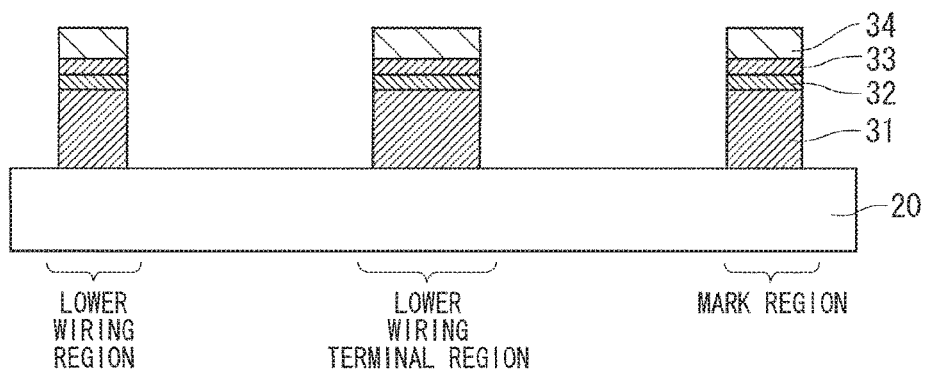

Next, as shown in FIG. 27, the resist mask RM3 is removed with a resist stripping liquid such as a mixed liquid of monoethanolamine and dimethyl sulfoxide.

Figure 28:
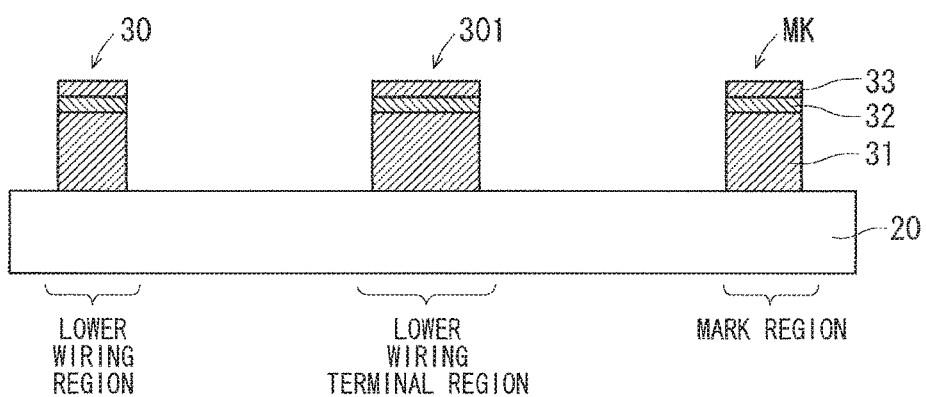

Then, the non low-reflection film 34 is removed for example with mixed acid of phosphoric acid, nitric acid, and acetic acid, thereby a lower wiring 30, a lower wiring terminal 301, and a mark group MK shown in FIG. 28.

An upper wiring 40 and an upper wiring terminal 401 are formed by the same method as that of the first preferred embodiment, so that formation thereof is not described again.

As described above, in the manufacturing method of the second preferred embodiment, the non low-reflection film 341 is formed once on the translucent film 331. The non low-reflection film 341 is a film to realize stable focusing operation on the entire substrate during exposure after application of the resist material of a certain thickness in the photolithography step for forming the lower wiring. The non low-reflection film 341 has a reflectance for example of 25% or more relative to light from a light source for the focusing operation.

It is desirable that the non low-reflection film 341 be made of a material having high etching selectivity compared to the conductive film 311. If having low etching selectivity, the non low-reflection film 341 may be formed to the smallest possible thickness within a range that satisfies the aforementioned reflectance, thereby preventing the wiring from becoming a canopy shape.

As described above, the non low-reflection film is formed during formation of the patterns for the lower wiring, the lower wiring terminal, and the mark group. This facilitates printing of a panel ID or a sheet ID and ensures traceability even on the occurrence of a trouble in a device in an array step, thereby contributing to quality stabilization.

<Modification>

In the aforementioned second preferred embodiment, a non low-reflection film is formed on a translucent film. The non low-reflection film may also be formed on a transparent film. A method of manufacturing such a structure is described below by referring to FIGS. 29 to 33.

Figure 29:
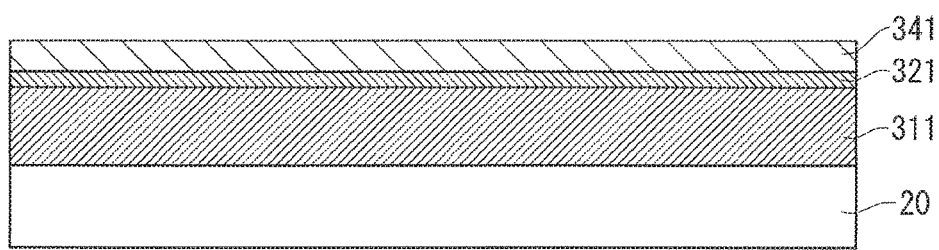

First, in the step shown in FIG. 29, by using an AlNiNd target, an AlNiNd film 311 to become a conductive film is deposited by sputtering process on a transparent substrate 20 to a thickness of 300 nm. Then, an ITO film 321 to become a transparent film is deposited by sputtering process on the AlNiNd film 311 to a thickness of 50 nm. Then, an Mo film 341 to become a non low-reflection film is deposited by sputtering process on the ITO film 321 to a thickness of 10 nm.

Figure 30:
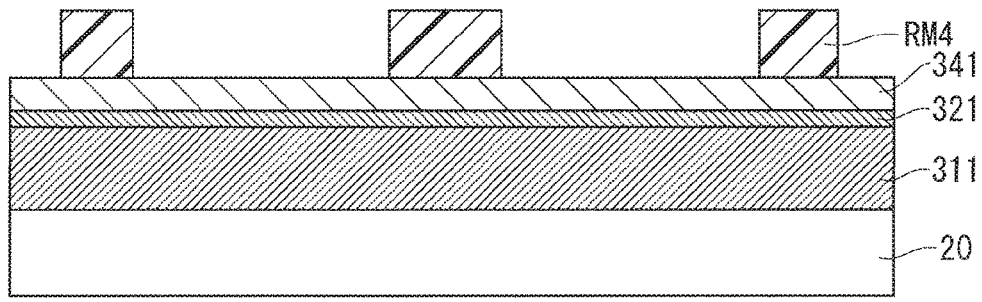

Next, a resist material is applied on the Mo film 341, and then patterns for a lower wiring, a lower wiring terminal, and a mark are exposed and developed, thereby patterning a resist mask RM4 having the patterns for the lower wiring, the lower wiring terminal, and the mark group (including a mark and an ID, for example) as shown in FIG. 30.

Figure 31:
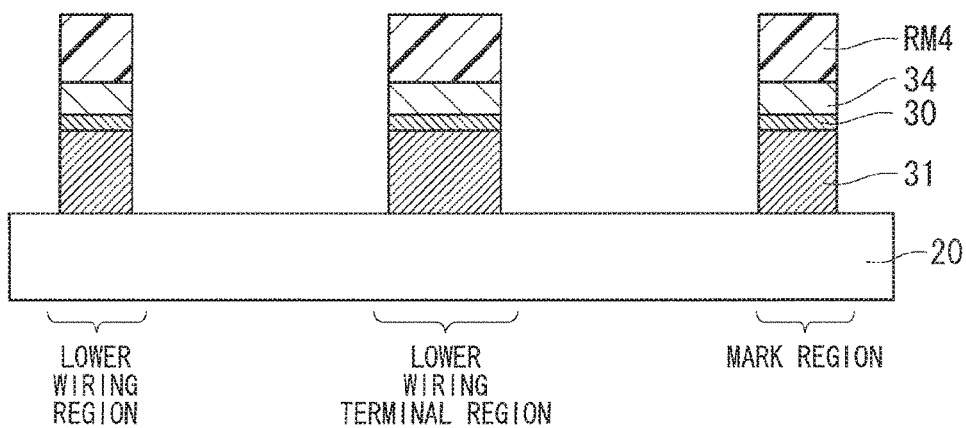

Next, as shown in FIG. 31, by using the resist mask RM4 as an etching mask, the Mo film 341 is etched for example with mixed acid of phosphoric acid, nitric acid, and acetic acid. Then, the ITO film 321 is etched with an oxalic acid solution, thereby patterning a non low-reflection film 34 and a transparent film 32. Next, the AlNiNd film 311 is etched for example with mixed acid of phosphoric acid, nitric acid, and acetic acid to pattern a conductive film 31.

Figure 32:
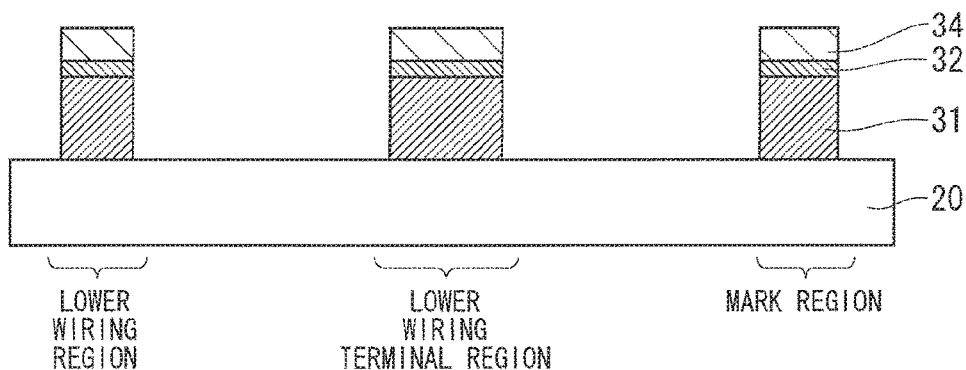

Next, as shown in FIG. 32, the resist mask RM4 is removed with a resist stripping liquid such as a mixed liquid of monoethanolamine and dimethyl sulfoxide.

Figure 33:
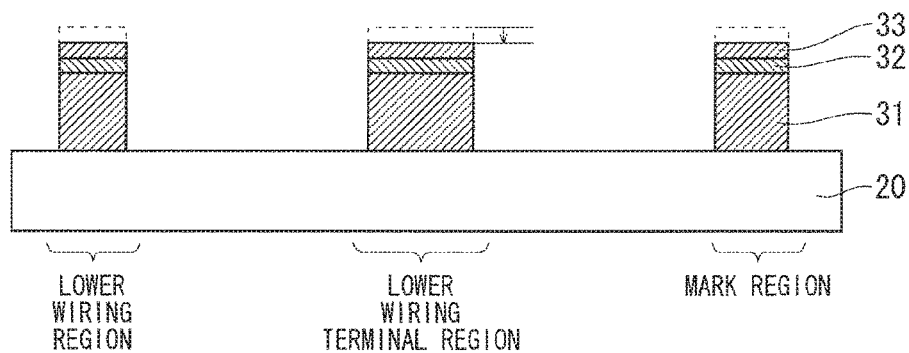

Then, as shown in FIG. 33, the non low-reflection film 34 is half etched to be reduced in thickness to about 5 nm. As a result, the non low-reflection film 34 is given light-transmitting properties to become usable as a translucent film 33.

Exemplary ways of the half etching include dry etching process with $CF_4$ gas and the like, and process realized by a combination of surface oxidation with $O_2$ plasma and removal of the resultant oxidized Mo surface.

An upper wiring 40 and an upper wiring terminal 401 are formed by the same method as that of the first preferred embodiment, so that formation thereof is not described again.

The aforementioned manufacturing method can reduce steps of forming films to function optically, compared to the case where both a non low-reflection film and a translucent film are formed. This achieves reduction in material for film deposition and reduction in required etching unit, thereby allowing reduction in cost for manufacturing processes.

Third Preferred Embodiment

Figure 34:
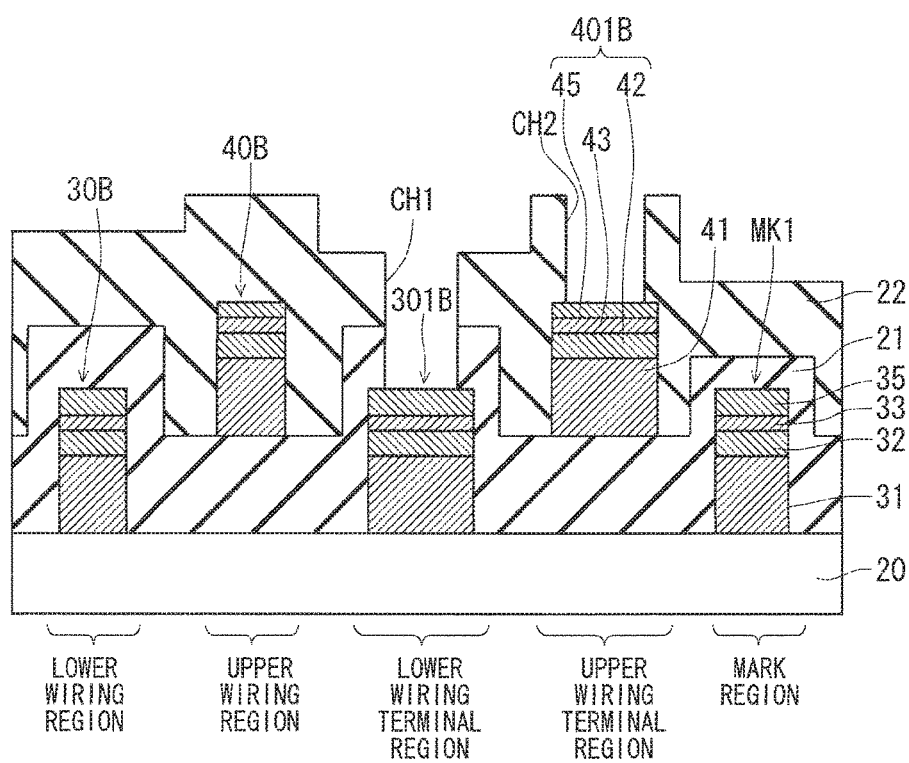
FIGS. 34 and 35 are sectional views each showing the structure of a touch panel according to a third preferred embodiment of the preset invention.

FIG. 34 shows the structure in cross section of a touch panel 12 of a third preferred embodiment. As shown in FIG. 34, the touch panel 12 of the third preferred embodiment includes: a transparent substrate 20; a lower wiring 30B, a lower wiring terminal 301B, and a mark group MK1 arranged on the transparent substrate 20; and an interlayer insulating film 21 arranged so as to cover the lower wiring 30B, the lower wiring terminal 301B, and the mark group MK1. The lower wiring 30B, the lower wiring terminal 301B, and the mark group MK1 are each a laminated wiring composed of a conductive film 31, a transparent film 32, a translucent film 33, and a transparent film 35 laminated in this order.

An upper wiring 40B and an upper wiring terminal 401B are arranged on the interlayer insulating film 21. The upper wiring 40B and the upper wiring terminal 401B are each a laminated wiring composed of a conductive film 41, a transparent film 42, a translucent film 43, and a transparent film 45 laminated in this order. A protection insulating film 22 is arranged so as to cover the upper wiring 40B and the upper wiring terminal 401B.

The conductive film 31 is made of an Al-based alloy such as AlNiNd as a low-resistance material and has a thickness of 300 nm, for example.

The transparent film 32 is composed of an IZO film and has a thickness of 50 nm, for example. The translucent film 33 is composed of an Mo film and has a thickness of 8 nm, for example. The transparent film 35 is composed of an IZO film and has a thickness of 60 nm, for example. The interlayer insulating film 21 is composed of a silicon oxide film and has a thickness of 600 nm, for example.

The conductive film 41 is made of an Al-based alloy such as AlNiNd as a low-resistance material and has a thickness of 400 nm, for example. The transparent film 42 is composed of an IZO film and has a thickness of 50 nm, for example. The translucent film 43 is composed of an Mo film and has a thickness of 8 nm, for example. The transparent film 45 is composed of an IZO film and has a thickness of 60 nm, for example. The protection insulating film 22 is composed of a silicon oxide film and has a thickness of 300 nm, for example.

A contact hole CH1 is formed above the lower wiring terminal 301B so as to penetrate the protection insulating film 22 and the interlayer insulating film 21 to reach the transparent film 35. A contact hole CH2 is formed above the upper wiring terminal 401B so as to penetrate the protection insulating film 22 to reach the transparent film 45.

Figure 35:
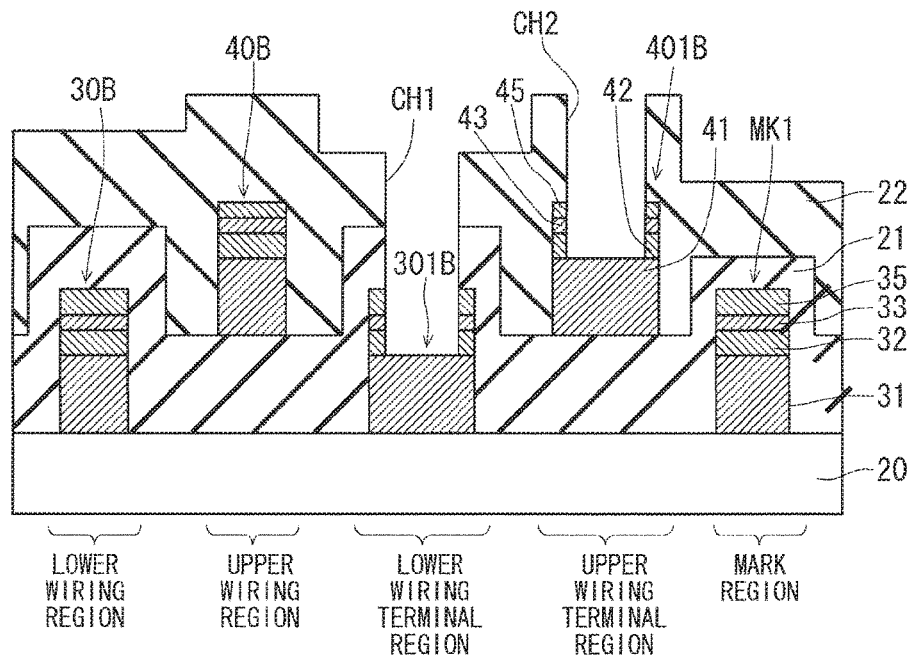

As shown FIG. 35, the contact hole CH1 may also be formed so as to penetrate the transparent film 35, the translucent film 33, and the transparent film 32 to reach the conductive film 31. Further, the contact hole CH2 may also be formed so as to penetrate the transparent film 45, the translucent film 43, and the transparent film 42 to reach the conductive film 41. In this case, a contact resistance between an FPC and a terminal can be reduced.

The contact hole CH1 may not penetrate all of the transparent film 35, the translucent film 33, and the transparent film 32, but it may penetrate some of the laminated films. Further, the contact hole CH2 may not penetrate all of the transparent film 45, the translucent film 43, and the transparent film 42, but it may penetrate some of the laminated films. In this case, a contact resistance between an FPC and a terminal can be reduced.

In the aforementioned touch panel 12 of the third preferred embodiment, the translucent film is covered with the transparent film. This can suppress change of the transmittance and the reflectance of the translucent film due to oxidation thereof to occur if the laminated films are subjected to a thermal step before formation of the interlayer insulating film 21 and the protection insulating film 22, thereby achieving a stable low-reflection structure.

Forming an wiring as the laminated wiring of the conductive film, the transparent film, the translucent film, and the transparent film enhances effect realized by interference between reflected light at an interface of the transparent film with the interlayer insulating film or the protection insulating film and reflected light from a lower layer derived from transmitted light, thereby achieving lower reflection.

The transparent films 32 and 42 are each described as a transparent film composed of an IZO film and having a thickness of 50 nm. Such a transparent film is not the only example of the transparent films 32 and 42. Any transparent film adjusted so as to achieve an optical path length of from 0.09 to 0.14 μm can reduce reflection of light from the conductive films 31 and 41.

Regarding a material for the transparent films 32 and 42, a transparent conductive film made for example of ITO achieves the same effect. A transparent insulating film made for example of SiN, SiO$_2$, Al$_2$O$_3$, transparent AlN, Ta$_2$O$_5$, ZrO$_2$, Y$_2$O$_3$, HfO$_2$, Nb$_2$O$_5$, or TiO$_2$ also achieves the same effect.

The transparent films 35 and 45 are each described as a transparent film composed of an IZO film and having a thickness of 60 nm. Such a transparent film is not the only example of the transparent films 35 and 45. As long as the transparent films 35 and 45 are made of a material having a refractive index higher than that of an insulating film close to incident light from outside, reflection is prevented effectively.

A transparent film adjusted in thickness so as to provide an optical path length of from 0.02 to 0.20 μm and desirably, from 0.07 to 0.15 μm can reduce reflection of light from the conductive films 31 and 41.

It is desirable that the transparent film 32 be shorter in optical path length than the transparent film 35 and the transparent film 42 be shorter in optical path length than the transparent film 45. Making the transparent films 35 and 45 longer in optical path length than the transparent films 32 and 42 respectively reduces reflection of visible light in a short wavelength region sufficiently in a lower layer and reduces reflection of light from a different region sufficiently only in an upper layer or both in the upper and lower layers. As a result, light to reflect off the conductive film can be reduced more reliably.

If the touch panel 12 of FIG. 2 is turned upside down to make the rear surface of the touch panel 12 (surface of the transparent substrate 20 on which films are not laminated) become the front surface of the display 100, the vertical positions of the transparent film, the translucent film, the transparent film, and the conductive film forming the aforementioned laminated structure are changed relative to each other. In this case, by laminating the transparent film, the translucent film, the transparent film, and the conductive film in this order as viewed from a foundation layer, reflection of light to enter from the front surface of the display 100 corresponding to the rear surface of the touch panel 12, namely, light to enter from the foundation layer can be reduced.

As described above, turning the touch panel 12 upside down changes the vertical positions of the films in the laminated structure relative to each other, and this is also applicable to the case where films in the laminated structure are formed on the protection glass 13. More specifically, laminating the transparent film, the translucent film, the transparent film, and the conductive film in this order on a surface of the protection glass 13 opposite the front surface of the display 100 can also reduce reflection of light to enter from the foundation layer. In this structure, the transparent film close to the foundation layer is made of a material higher in refractive index than that of the foundation layer.

Regarding a material for the transparent films 35 and 45, a transparent conductive film made for example of ITO achieves the same effect. A transparent insulating film made for example of SiN, Al$_2$O$_3$, transparent AlN, Ta$_2$O$_5$, ZrO$_2$, Y$_2$O$_3$, HfO$_2$, Nb$_2$O$_5$, or TiO$_2$ is also applicable.

The translucent films 33 and 43 are each described as an Mo film and having a thickness of 8 nm. Such an Mo film is not the only example of the translucent films 33 and 43. Any film adjusted so as to achieve a light transmittance of from 10% to 70% is applicable as the translucent films 33 and 43. By way of example, the translucent films 33 and 43 are made of a metal such as Cr, Ti, Ni, Ta, and W, or an alloy mainly containing any of these metals listed here such as a Cr-based alloy, and have a thickness of from 2 to 12 nm, desirably about 8 nm.

The conductive films 31 and 41 are described as being made of AlNiNd in the aforementioned example. Each of the conductive films 31 and 41 may also be a film of Al and a different Al-based alloy, a laminated film of Ag and an Ag-based alloy, a film of Cu and a Cu-based alloy, a laminated film of Cr and an Al-based alloy, or a laminated film of Mo and an Al-based alloy.

Like the transparent films 32 and 42, the transparent films 35 and 45 can be formed by sputtering process, and the other films are formed in the method described in the first preferred embodiment. Thus, the manufacturing method of the third preferred embodiment will not be described.

<Modification>

Like in the second preferred embodiment, in the aforementioned structure in cross section of the touch panel 12 of the third preferred embodiment, a non low-reflection film may be formed as the uppermost surface during formation of a lower wiring, and the non low-reflection film may be removed after patterning of the lower wiring.

More specifically, an Mo film to become the non low-reflection film is deposited on the transparent film 35 to a thickness of 10 nm. After patterning by photolithography, the non low-reflection film as the uppermost surface is removed by etching. In this way, the non low-reflection film is formed during formation of the patterns for the lower wiring, the lower wiring terminal, and the mark. This facilitates printing of a panel ID or a sheet ID and ensures traceability even on the occurrence of a trouble in a device in an array step, thereby contributing to quality stabilization.

To increase etching selectively relative to a transparent film, annealing may be performed in a temperature of about 230° C. for example to make the transparent film crystallize before the non low-reflection film is removed. In this case, it is desirable that the transparent film be made of a material such as ITO that crystallizes as a result of heating process.

Fourth Preferred Embodiment

Figure 36:
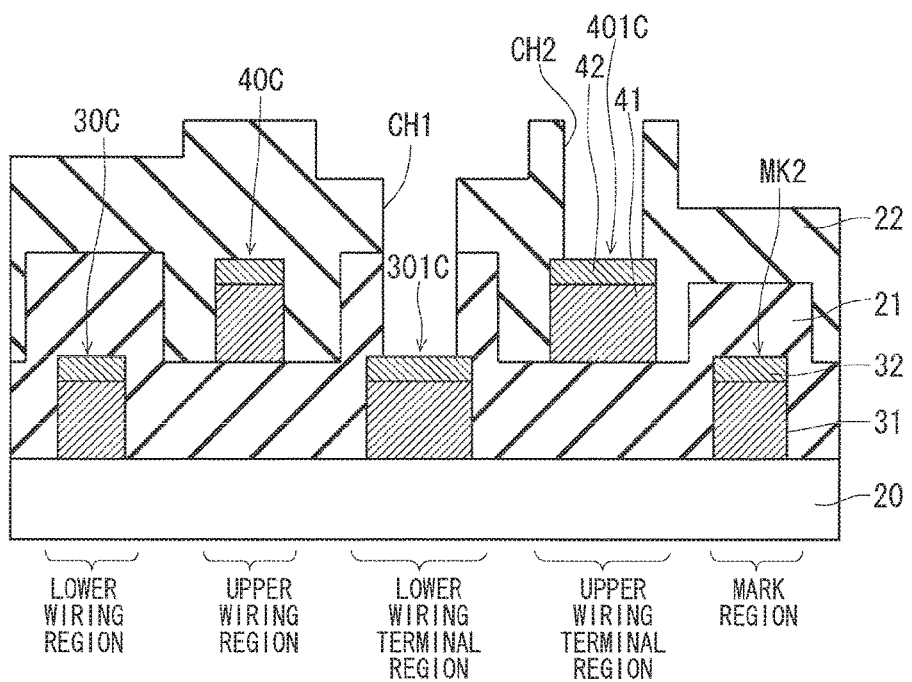
FIG. 36 is a sectional view showing the structure of a touch panel according to a fourth preferred embodiment of the present invention.

FIG. 36 shows the structure in cross section of a touch panel 12 of a fourth preferred embodiment. As shown in FIG. 36, the touch panel 12 of the fourth preferred embodiment includes: a transparent substrate 20; a lower wiring 30C, a lower wiring terminal 301C, and a mark group MK2 arranged on the transparent substrate 20; and an interlayer insulating film 21 provided so as to cover the lower wiring 30C, the lower wiring terminal 301C, and the mark group MK2. The lower wiring 30C, the lower wiring terminal 301C, and the mark group MK2 are each a laminated wiring composed of a conductive film 31 and a transparent film 32 laminated in this order.

An upper wiring 40C and an upper wiring terminal 401C are arranged on the interlayer insulating film 21. The upper wiring 40C and the upper wiring terminal 401C are each a laminated wiring composed of a conductive film 41 and a transparent film 42 laminated in this order. A protection insulating film 22 is arranged so as to cover the upper wiring 40C and the upper wiring terminal 401C.

The conductive film 31 is made of an Mo-based alloy such as MoNb and has a thickness of 300 nm, for example.

The transparent film 32 is composed of an IZO film and has a thickness of 60 nm, for example. The interlayer insulating film 21 is composed of a silicon oxide film and has a thickness of 600 nm, for example.

The conductive film 41 is made of an Mo-based alloy such as MoNb and has a thickness of 400 nm, for example.

The transparent film 42 is composed of an IZO film and has a thickness of 60 nm, for example. The protection insulating film 22 is composed of a silicon oxide film and has a thickness of 300 nm, for example.

A contact hole CH1 is formed above the lower wiring terminal 301C so as to penetrate the protection insulating film 22 and the interlayer insulating film 21 to reach the transparent film 32. A contact hole CH2 is formed above the upper wiring terminal 401C so as to penetrate the protection insulating film 22 to reach the transparent film 42.

The aforementioned touch panel 12 of the fourth preferred embodiment does not include a translucent film between the conductive film and the transparent film, so that film deposition process is managed easily.

The transparent films 32 and 42 are each described as a transparent film composed of an IZO film and having a thickness of 60 nm. Such a transparent film is not the only example of the transparent films 32 and 42. The transparent films 32 and 42 may be made of any material that has a refractive index higher than that of an insulating film close to incident light from outside. A transparent film adjusted in thickness so as to provide an optical path length of from 0.02 to 0.20 µm and desirably, from 0.07 to 0.15 µm is also applicable as the transparent films 32 and 42.

Regarding a material, the transparent films 32 and 42 may each be a transparent conductive film made for example of ITO, or a transparent insulating film made for example of SiN, $Al_2O_3$, transparent AlN, $Ta_2O_5$, $ZrO_2$, $Y_2O_3$, $HfO_2$, $Nb_2O_5$, or $TiO_2$.

The conductive films 31 and 41 are described as being made of MoNb in the aforementioned example. Each of the conductive films 31 and 41 may also be a conductive film made of a material such as Cr, Ti, Ni, Ta, and W that have a reflectance of 70% or less in a visible light region (from 380 nm to 780 nm).

Additionally, forming a laminated structure by adding a conductive film as a lower layer made of a material such as an Al alloy having a resistivity of 10 µΩcm or less at room temperature achieves reduction in reflection of light and at the same time, reduction in wiring resistance.

Fifth Preferred Embodiment

FIG. 37 shows the structure in cross section of a touch panel 12 of a fifth preferred embodiment. As shown in FIG. 37, the touch panel 12 of the fifth preferred embodiment includes: a transparent substrate 20; a lower wiring 30D, a lower wiring terminal 301D, and a mark group MK3 arranged on the transparent substrate 20 and each composed of a conductive film 31; a transparent film 36 as an antireflection film arranged so as to cover the lower wiring 30D, the lower wiring terminal 301D, and the mark group MK3; and an interlayer insulating film 21 arranged so as to cover the transparent film 36.

An upper wiring 40D and an upper wiring terminal 401D, each composed of a conductive film 41, are arranged on the interlayer insulating film 21. A transparent film 46 as an antireflection film is arranged so as to cover the upper wiring 40D and the upper wiring terminal 401D. A protection insulating film 22 is arranged so as to cover the transparent film 46.

The conductive film 31 is made of an Mo-based alloy such as MoNb and has a thickness of 300 nm, for example.

The transparent film 36 is composed of an SiN film and has a thickness of 55 nm, for example. The interlayer insulating film 21 is composed of a silicon oxide film and has a thickness of 600 nm, for example.

The conductive film 41 is made of an Mo-based alloy such as MoNb and has a thickness of 400 nm, for example.

The transparent film 46 is composed of an SiN film and has a thickness of 55 nm, for example. The protection insulating film 22 is composed of a silicon oxide film and has a thickness of 300 nm, for example.

A contact hole CH1 is formed above the lower wiring terminal 301D so as to penetrate the protection insulating film 22, the transparent film 46, the interlayer insulating film 21, and the transparent film 36 to reach the conductive film 31. A contact hole CH2 is formed above the upper wiring terminal 401D so as to penetrate the protection insulating film 22 and the transparent film 46 to reach the conductive film 41.

In the aforementioned touch panel 12 of the fifth preferred embodiment, a side surface of the wiring is also covered with the transparent film, allowing suppression of reflection at the side surface of the wiring. This achieves a favorable low-reflection wiring, even if the wiring is reduced in width and increased in thickness with the intention of increasing the aperture ratio of the touch panel.

As a result of the aforementioned simple wiring structure, a film deposition step and a patterning step can be simplified, achieving reduction in manufacturing steps. If the transparent films 36 and 46 are deposited by CVD process, a low-reflection structure can extend further to be closer to a substrate edge. This can increase the number of panels to be obtained from one mother substrate, allowing reduction in manufacturing cost.

The transparent films 36 and 46 are each described as a transparent film composed of an SiN film and having a thickness of 55 nm. Such a transparent film is not the only example of the transparent films 36 and 46. As long as the transparent films 36 and 46 are made of a material having a refractive index higher than that of an insulating film close to incident light from outside, reflection is prevented effectively.

A transparent film adjusted in thickness so as to provide an optical path length of from 0.02 to 0.20 μm and desirably, from 0.07 to 0.15 μm can reduce reflection of light from the conductive films 31 and 41.

Regarding a material, the transparent films 36 and 46 may be a transparent insulating film made for example of $Al_2O_3$, transparent AlN, $Ta_2O_5$, $ZrO_2$, $Y_2O_3$, $HfO_2$, $Nb_2O_5$, or $TiO_2$.

It is desirable that the transparent films 36 and 46 be made of a material and have a thickness that make light to pass through part where no wiring is formed become whitish.

The conductive films 31 and 41 are each described as being made of MoNb in the aforementioned example. Each of the conductive films 31 and 41 may also be a conductive film made of a material such as Cr, Ti, Ni, Ta, and W that have a reflectance of 70% or less in a visible light region (from 380 nm to 780 nm).

<First Modification>

In the aforementioned fifth preferred embodiment, the lower and upper wirings 30D and 40D have a single-layer structure composed of the conductive films 31 and 41 respectively. The lower and upper wiring 30D and 40D may also be laminated wirings each composed of two layers as shown in FIG. 38.

More specifically, a lower wiring 30E shown in FIG. 38 includes a conductive film such as an Mo-based alloy film 3020 having a reflectance of 70% or less in a visible light region (from 380 nm to 780 nm), and a low-resistance conductive film such as an Al-based alloy film 3010 formed under the Mo-based alloy film 3020 and having a resistivity of 10 μΩcm or less at room temperature.

As shown in FIG. 38, the Mo-based alloy film 3020 is formed so as to cover a surface of the Al-based alloy film 3010 trapezoidal in cross section including a side surface thereof. The transparent film 36 is formed as an antireflection film so as to cover the entire transparent substrate 20 from above on which the lower wiring 30E is formed. A lower wiring terminal, an upper wiring, an upper wiring terminal, and a mark group have the same structure as that of the lower wiring 30E.

The aforementioned structure achieves reduction in reflection of light and at the same time, reduction in wiring resistance.

As shown in FIG. 39, the transparent film 36 may be patterned into the same shape as the lower wiring 30E, and is not always required to cover the entire transparent substrate 20 from above.

If the transparent film is patterned into the aforementioned shape, not only a transparent insulating film but also a transparent conductive film is applicable as the transparent film.

Regarding the position of the pattern edge of the conductive film and that of the pattern edge of the transparent film relative to each other, these pattern edges may be at the same position, the edge of the conductive film may be outward of that of the transparent film, or the edge of the transparent film may be outward of that of the conductive film as shown in FIG. 39 depending on process of forming the transparent film. Any of these relative positions is applicable, whereas it is desirable that the edge of the transparent film be outward of that of the conductive film.

A method of manufacturing the first modification of the fifth preferred embodiment is described next by referring to FIGS. 40 to 43. Only the lower wiring 30E of FIG. 38 is described below. The lower wiring terminal, the upper wiring, the upper wiring terminal, and the mark group are not shown in the drawings.

As shown in FIG. 40, by using an AlNiNd target, an AlNiNd film to become a low-resistance conductive film is deposited by sputtering process on the transparent substrate 20 to a thickness of 300 nm. Then, a resist material is applied on the AlNiNd film, and a resist mask for the lower wiring, the lower wiring terminal, and the mark group is formed in a photolithography step.

Next, by using this resist mask as etching masks, the AlNiNd film is etched to pattern the Al-based alloy film 3010.

Next, as shown in FIG. 41, an MoNb film 3021 is deposited for example by sputtering on the Al-based alloy film 3010 to a thickness of 50 nm.

Next, a resist mask is formed so as to cover the Al-based alloy film 3010 and the MoNb film 3021 on the Al-based alloy film 3010. Then, by using this resist mask as an etching mask, part of the MoNb film 3021 not covered with the resist mask is removed by etching with mixed acid of phosphoric acid, nitric acid, and acetic acid, thereby providing a structure of FIG. 42 where the Al-based alloy film 3010 is covered with the Mo-based alloy film 3020.

Removing the MoNb film 3021 from above the mark group in this step can suppress reduction of a reflectance observed on the mark group after the transparent film 36 is formed. This allows increase of a mark recognition rate in a later step without the need of removing the MoNb film 3021 in a step of forming an opening of a terminal part.

Next, as shown in FIG. 43, an SiN film is formed for example by CVD process to a thickness of 50 nm so as to cover the entire transparent substrate 20 from above including part thereof on which the Mo-based alloy film 3020 is formed, thereby obtaining the transparent film 36.

Next, a silicon oxide film is formed as an example of the interlayer insulating film 21 by CVD process to a thickness of 600 nm, thereby obtaining the structure of FIG. 38. The transparent film 36 and the interlayer insulating film 21 may be formed in successive film deposition steps in a vacuum atmosphere by using the same CVD unit.

The structure of FIG. 39 is obtained as follows. After formation of the transparent film 36 shown in FIG. 43, a resist mask covering the Al-based alloy film 3010 from above is formed. Next, by using this resist mask as an etching mask, the transparent film 36 is etched, and then the resist mask is removed. Next, a silicon oxide film is formed as an example of the interlayer insulating film 21 by CVD process.

After the step of FIG. 41, a transparent film 361 may be obtained by forming an IZO film for example by sputtering process on the MoNb film 3021 to a thickness of 60 nm.

Then, a resist mask covering the Al-based alloy film 3010 from above is formed. Next, by using this resist mask as an etching mask, the transparent film 361 is etched with oxalic acid. The MoNb film 3021 is thereafter etched with mixed acid of phosphoric acid, nitric acid, and acetic acid, and then the resist mask is removed. FIG. 45 shows the cross section of a resultant structure at this stage. In this way, the transparent film 361 and the Mo-based alloy film 3020 may be patterned in single photolithography.

The Al-based alloy film 3010 as a low-resistance conductive film may be replaced by a Cu—Mo alloy, and an Mo-based film may be formed on a surface of the Cu—Mo alloy by precipitation caused by heat treatment, for example.

The Mo-based alloy film 3020 is described as being made of MoNb in the aforementioned example. The Mo-based alloy film may be replaced by a conductive film made of a material such as Cr, Ti, Ni, Ta, and W that have a reflectance of 70% or less in a visible light region (from 380 nm to 780 nm).

<Second Modification>

In the aforementioned fifth preferred embodiment, in the lower wiring 30D or 30E, a surface of a film having a reflectance of 70% or less is covered only with the transparent film 36. Further, in the upper wiring 40D or 40E, a surface of a film having a reflectance of 70% or less is covered only with the transparent film 46. Meanwhile, each of these films may also be covered with multiple films as shown in FIGS. 46 and 47.

More specifically, in a lower wiring 30F shown in FIG. 46, a transparent film 3020 covers an upper surface and a side surface of a low-resistance conductive film such as an Al-based alloy film 3010 having a resistivity of 10 μΩcm or less at room temperature, and a translucent film 3030 covers the transparent film 3020 from above. The transparent film 3020 and the translucent film 3030 function as antireflection films.

In a lower wiring 30G shown in FIG. 47, the transparent film 3020 covers the upper surface and the side surface of the Al-based alloy film 3010, the translucent film 3030 covers the transparent film 3020 from above, and a transparent film 3040 covers the translucent film 3030 from above.

The aforementioned structures achieve the same effects as those of the first and third preferred embodiments. The materials and the thicknesses of the transparent film and the translucent film can be determined in the same way as in the first and third preferred embodiments.

In the aforementioned first to fifth preferred embodiments, the interlayer insulating film and the protection insulating film are each described as a silicon oxide film. However, a silicon oxide film is not the only example. As an example, each of the interlayer insulating film and the protection insulating film may also be an SOG film formed by coating that does not generate undesirable coloring of light to pass through a light-transmitting part except a wiring part. Using an SOG film as the interlayer insulating film 21 suppresses a short-circuit to be generated at an intersection of an upper wiring and a lower wiring.

The wirings described in the first to fifth preferred embodiments are applied as wirings for a touch panel. These wirings may also be applied as those for a display device, or as light-shielding layers to reduce reflection.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A display, comprising:
   a stacked interconnect with a conductive film arranged on a foundation layer, and a transparent film arranged on said conductive film;
   an interconnect terminal part arranged at an edge portion of said stacked interconnect, said interconnect terminal part having a stacked structure being the same as at least that of said stacked interconnect; and
   an insulating film that covers said stacked interconnect and said interconnect terminal part, wherein
   said transparent film has an optical path length of from 0.02 to 0.20 μm,
   said transparent film is higher in refractive index than said insulating film, and
   at least a portion of said interconnect terminal part is exposed for making electrical contact.

2. The display according to claim 1, wherein said conductive film contains a material selected from Mo, Cr, Ti, Ni, Ta, and W.

3. The display according to claim 1, wherein said conductive film is composed of stacked films including a first conductive film containing a material selected from Mo, Cr, Ti, Ni, Ta, and W, and a second conductive film having a resistivity of 10 μΩcm or less at room temperature.

4. The display according to claim 1, comprising an image display module arranged on a main surface of said foundation layer opposite a main surface thereof on which said stacked interconnect and said interconnect terminal part are arranged.

5. The display according to claim 1, further comprising a contact hole formed in the interconnect terminal part to penetrate the insulating film and the antireflection film.

6. A display, comprising:
   an interconnect layer with a conductive film arranged on a foundation layer;
   an interconnect terminal part arranged at an edge portion of said interconnect layer, said interconnect terminal part having the same structure as that of said interconnect layer;
   an antireflection film that covers an upper surface and a side surface of said conductive film; and
   an insulating film that covers said antireflection film, wherein
   at least a portion of said interconnect terminal part is exposed for making electrical contact.

7. The display according to claim 6, wherein
said antireflection film is a transparent insulating film that covers said foundation layer entirely,
said transparent insulating film has an optical path length of from 0.02 to 0.20 µm, and
said transparent insulating film is higher in refractive index than said insulating film.

8. The display according to claim 6, wherein said conductive film is composed of stacked films including a second conductive film having a resistivity of 10µΩcm or less at room temperature, and a first conductive film that covers an upper surface and a side surface of said second conductive film, the first conductive film containing a material selected from Mo, Cr, Ti, Ni, Ta, and W.

9. The display according to claim 6, wherein said antireflection film is composed of multiple films including a transparent film and a translucent film stacked in this order on said conductive film.

10. The display according to claim 9, wherein
said transparent film contains a material selected from: one of a group of oxides including indium oxide, zinc oxide, and tin oxide; one of a group of oxides mainly containing any of silicon, aluminum, tantalum, zirconium, yttrium, hafnium, niobium, and titanium; and one of a group of nitrides mainly containing silicon and aluminum, and
said translucent film contains a material selected from Mo, Cr, Ti, Ni, Ta, and W.

11. The display according to claim 6, wherein said antireflection film is composed of multiple films including a first transparent film, a translucent film, and a second transparent film stacked in this order on said conductive film.

12. The display according to claim 11, wherein
said first transparent film contains a material selected from: one of a group of oxides including indium oxide, zinc oxide, and tin oxide; one of a group of oxides mainly containing any of silicon, aluminum, tantalum, zirconium, yttrium, hafnium, niobium, and titanium; and one of a group of nitrides mainly containing silicon and aluminum,
said second transparent film contains a material selected from: one of a group of oxides including indium oxide, zinc oxide, and tin oxide; one of a group of oxides mainly containing any of aluminum, tantalum, zirconium, yttrium, hafnium, niobium, and titanium; and one of a group of nitrides mainly containing silicon and aluminum, and
said translucent film contains a material selected from Mo, Cr, Ti, Ni, Ta, and W.

13. The display according to claim 6, comprising an image display module arranged on a main surface of said foundation layer opposite a main surface thereof on which said interconnect layer and said interconnect terminal part are arranged.

14. The display according to claim 6, further comprising a contact hole formed in the interconnect terminal part to penetrate the insulating film and the antireflection film.

\* \* \* \* \*